(12) United States Patent
Onozawa et al.

(10) Patent No.: US 7,106,320 B2
(45) Date of Patent: Sep. 12, 2006

(54) POWER MODULE AND DISPLAY DEVICE

(75) Inventors: Makoto Onozawa, Kawasaki (JP);
Shigetoshi Tomio, Kawasaki (JP);
Tomokatsu Kishi, Kawasaki (JP);
Haruo Koizumi, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 166 days.

(21) Appl. No.: 10/321,363

(22) Filed: Dec. 18, 2002

(65) Prior Publication Data

US 2003/0122812 A1     Jul. 3, 2003

(30) Foreign Application Priority Data

Dec. 27, 2001  (JP)  ............................. 2001-398412
Oct. 23, 2002  (JP)  ............................. 2002-308619

(51) Int. Cl.
*G09G 5/00*     (2006.01)
(52) U.S. Cl. ..................... 345/211; 345/60; 345/68; 345/212
(58) Field of Classification Search ................. 345/60, 345/68, 211, 212
See application file for complete search history.

(56) References Cited

U.S. PATENT DOCUMENTS

| | | | |
|---|---|---|---|
| 5,717,437 A | 2/1998 | Sano et al. | .................. 345/211 |
| 6,320,561 B1 | 11/2001 | Arimoto et al. | |
| 6,803,889 B1 * | 10/2004 | Onozawa et al. | .............. 345/60 |
| 2001/0035862 A1 * | 11/2001 | Nakamura et al. | |
| 2003/0112231 A1 * | 6/2003 | Kurumisawa | ................ 345/212 |

FOREIGN PATENT DOCUMENTS

| | | |
|---|---|---|
| CN | 1249498 A | 4/2000 |
| EP | 0 762 373 A2 | 3/1987 |
| EP | 1 065 650 A2 | 1/2001 |
| EP | 1 139 323 A2 | 10/2001 |
| JP | 2000-89724 | 3/2000 |

OTHER PUBLICATIONS

Kishi, T., et al., "49.4: A New Driving Technology for PDPs with Cost Effective Sustain Circuit", *SID 01 Digest*, pp. 1236-1239.
Patent Abstracts of Japan of 9-160525 dated Jun. 20, 1997.
Patent Abstracts of Japan, Publication No. 03227045, Published Oct. 8, 1991, vol. 16, No. 4, (E-1151).
Kishi, et al., "49.4: A New Driving Technology for PDPs with Cost Effective Sustain Circuit", 2001 SID International Symposium Digest of Technical Papers, vol. 32, Jun. 2001, pp. 1236-1239.

* cited by examiner

*Primary Examiner*—Kent Chang
*Assistant Examiner*—Tammy Pham
(74) *Attorney, Agent, or Firm*—Staas & Halsey LLP

(57) ABSTRACT

A power module is provided which includes: a power-supply voltage terminal for inputting a power-supply voltage; a ground terminal; a first voltage terminal; a second voltage terminal; a first to a third switch; and a first to a third amplification circuit which amplify control signals for controlling the first to the third switch, respectively. The first switch is connected between the power-supply voltage terminal and the first voltage terminal. The second switch is connected between the first voltage terminal and the ground terminal. The third switch is connected between the second voltage terminal and the ground terminal.

44 Claims, 29 Drawing Sheets

F I G. 10
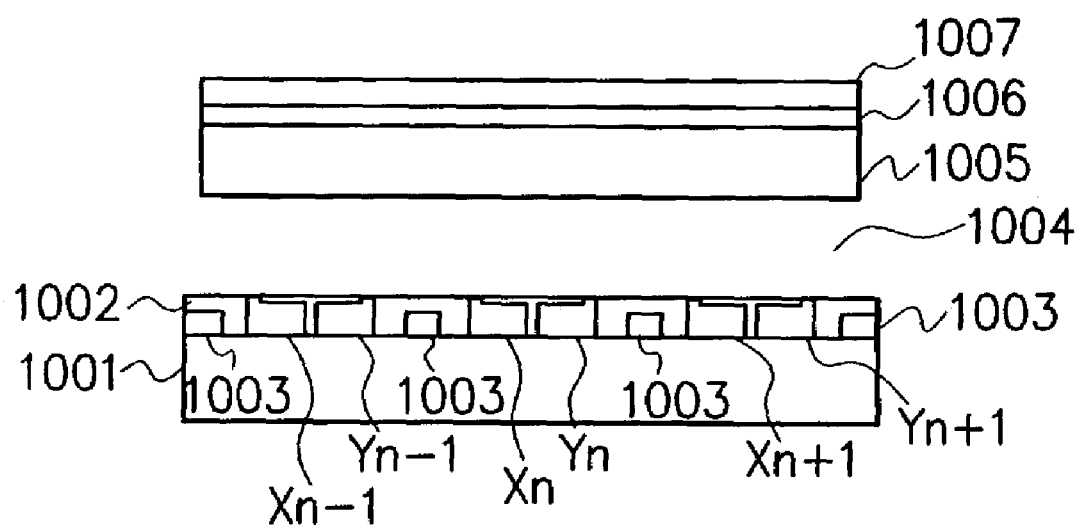

F I G. 12
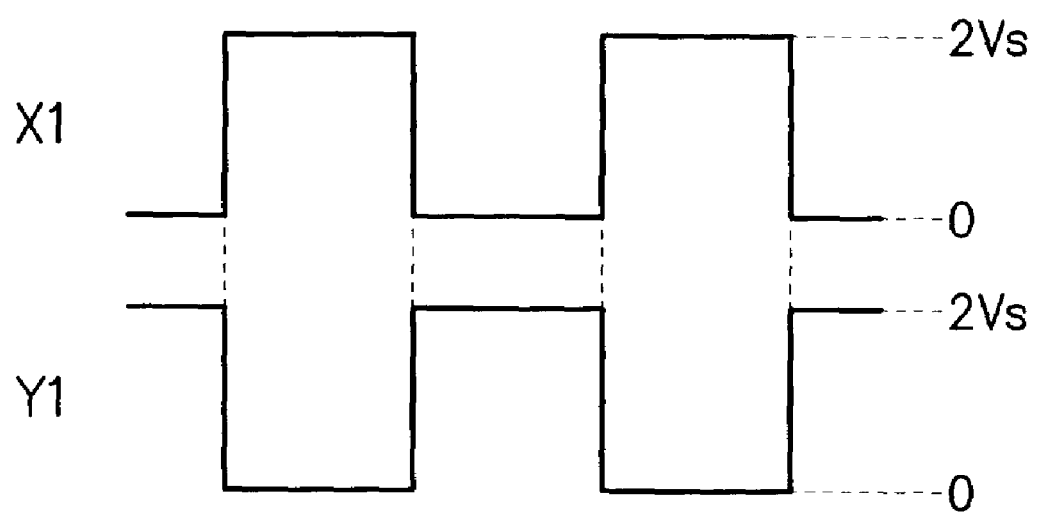

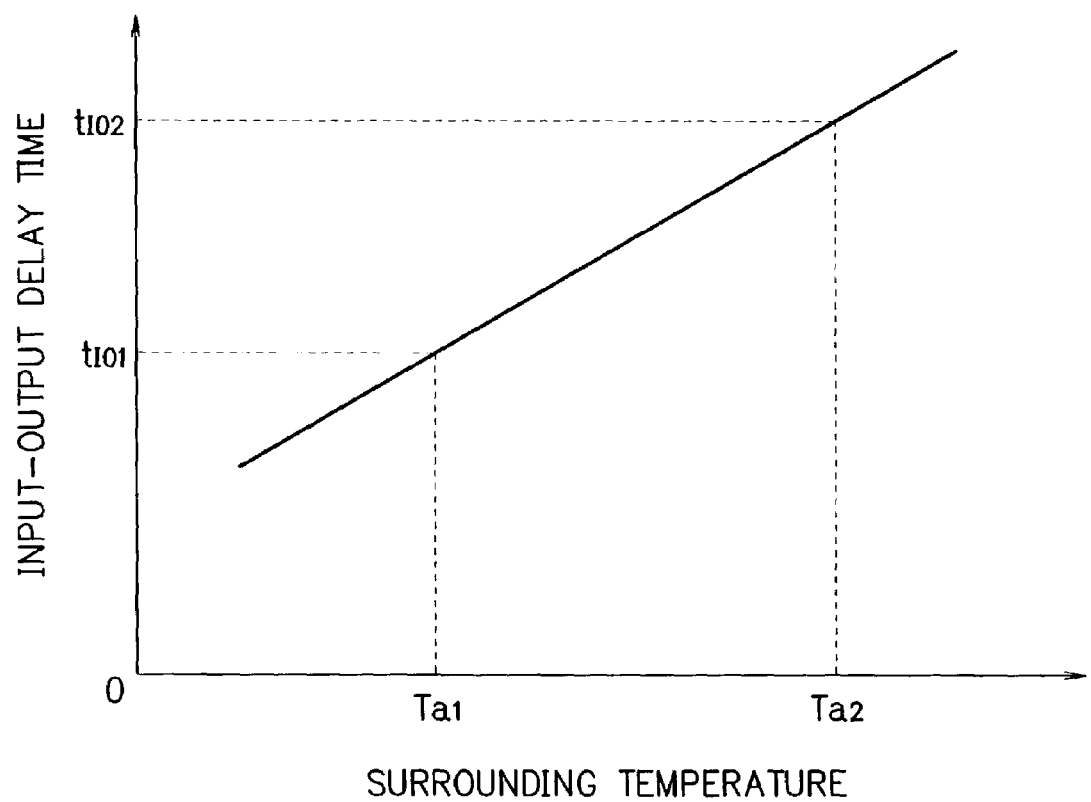
F I G. 16

F I G. 23
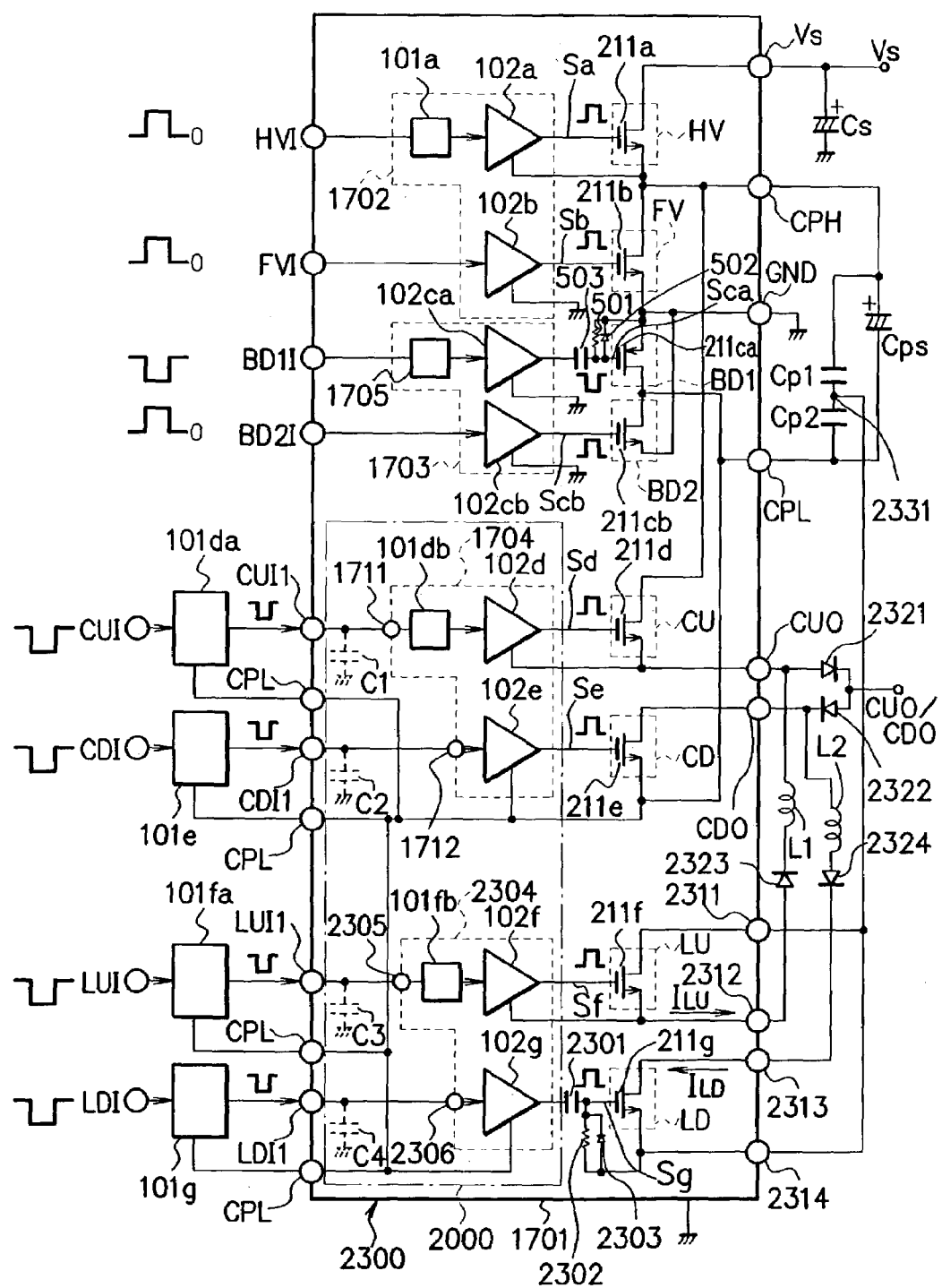

POWER MODULE AND DISPLAY DEVICE

CROSS-REFERENCE TO RELATED APPLICATIONS

This application is based upon and claims priority of Japanese Patent Application Nos. 2001-398412, filed on Dec. 27, 2001 and 2002-308619, filed on Oct. 23, 2002, the contents being incorporated herein by reference.

BACKGROUND OF THE INVENTION

1. Field of the Invention

The present invention relates to a power module and a display device using the same.

2. Description of the Related Art

As a well-known example for reducing the cost of circuits in plasma display devices, a method is described in the article by the title of "A New Driving Technology for PDPs with Cost Effective Sustain Circuit" in SID 01 DIGEST pages 1236 to 1239.

Further, there is a method disclosed in Japanese Patent Laid-Open No. 2000-89724 which is used for a power module in plasma display devices.

(Nonpatent Literature 1)

Kishi and four others "A New Driving Technology for PDPs with Cost Effective Sustain Circuit" SID 01 DIGEST, pages 1236 to 1239, 2001

(Patent Document 1)

Japanese Patent Laid-Open No. 2000-89724

To realize the aforementioned circuit described in FIG. 2 in page 1237 of SID 01 DIGEST, it is only required to use switching elements such as power MOSFETs, IGBTs or the like as switches SWA, SWB, SWC, SWD and SWE, and drive the switching elements by pre-drive circuits each composed of an IC or the like. However, in this pre-drive circuit, propagation delay (hereafter, called an input-output delay time) occurs between an input signal and an output signal depending on characteristics of an inner circuit thereof. This input-output delay time may change depending on the temperature surrounding the circuit, and one example thereof is shown in FIG. 16.

If the surrounding temperature of the pre-drive circuits for driving the switching elements are different from each other when the aforementioned circuit described in FIG. 2 in page 1237 of SID 01 DIGEST is operated, operation timings of the switching elements may change from values which have initially been set, so that margins of the operation timings come to small.

SUMMARY OF THE INVENTION

It is an object of the present invention to prevent a decrease in the margin of the aforesaid operation timing to further improve the reliability of the aforementioned circuit.

It is another object of the present invention to reduce parasitic capacitances existing in wirings of a power module so as to prevent a malfunction.

It is still another object of the present invention to reduce the size of circuits and the number of parts.

According to an aspect of the present invention, a power module is provided which includes: a power-supply voltage terminal for inputting a power-supply voltage; a ground terminal; a first voltage terminal; a second voltage terminal; a first to a third switch; and a first to a third amplification circuit which amplify control signals for controlling the first to the third switch, respectively. The first switch is connected between the power-supply voltage terminal and the first voltage terminal. The second switch is connected between the first voltage terminal and the ground terminal. The third switch is connected between the second voltage terminal and the ground terminal.

The modularization of the first to the third switch and the first to the third amplification circuit in the same power module makes it possible to decrease changes in the operation timings of the first to the third switch due to their surrounding temperatures so as to keep margins of their operation timings appropriate. The use of this power module in a display device enables further improvement in reliability of the display device.

According to another aspect of the present invention, a power module is provided which includes: a power-supply voltage terminal for inputting a power-supply voltage; a ground terminal; a first voltage terminal; a second voltage terminal; a first switch connected between the power-supply voltage terminal and the first voltage terminal; a second switch connected between the first voltage terminal and the ground terminal; a third switch connected between the second voltage terminal and the ground terminal; a first to a third amplification circuit which amplify control signals for controlling the first to the third switch, respectively; a third voltage terminal; a fourth voltage terminal; a fourth switch connected between the first voltage terminal and the third voltage terminal; a fifth switch connected between the second voltage terminal and the fourth voltage terminal; and a fourth and a fifth amplification circuit which amplify control signals for controlling the fourth and the fifth switch, respectively; a first and a second input wiring connected to inputs of the fourth and the fifth amplification circuit; and a metal substrate. The first to the fifth switch and the first to the third amplification circuit, except all or part of the fourth and the fifth amplification circuit and the first and the second input wiring, are provided on the metal substrate.

Since all or part of the fourth and the fifth amplification circuit and the first and the second input wiring are not provided on the metal substrate, the parasitic capacitances thereof can be reduced to prevent a malfunction of the power module. Further, the power module is constituted using the metal substrate, thereby enabling a reduction in size of the power module and the number of parts thereof as compared to the case where the respective circuits are constituted of discrete components.

BRIEF DESCRIPTION OF THE DRAWINGS

FIG. 10 is a view showing a plasma display panel of a progressive system;

FIG. 12 is a chart showing a waveform during a sustain period;

FIG. 16 is a view showing characteristics of a pre-drive circuit.

FIG. 23 is a view showing a power module and external circuits according to a sixth embodiment of the present invention;

DETAILED DESCRIPTION OF THE PREFERRED EMBODIMENTS

First Embodiment

Figure 1:
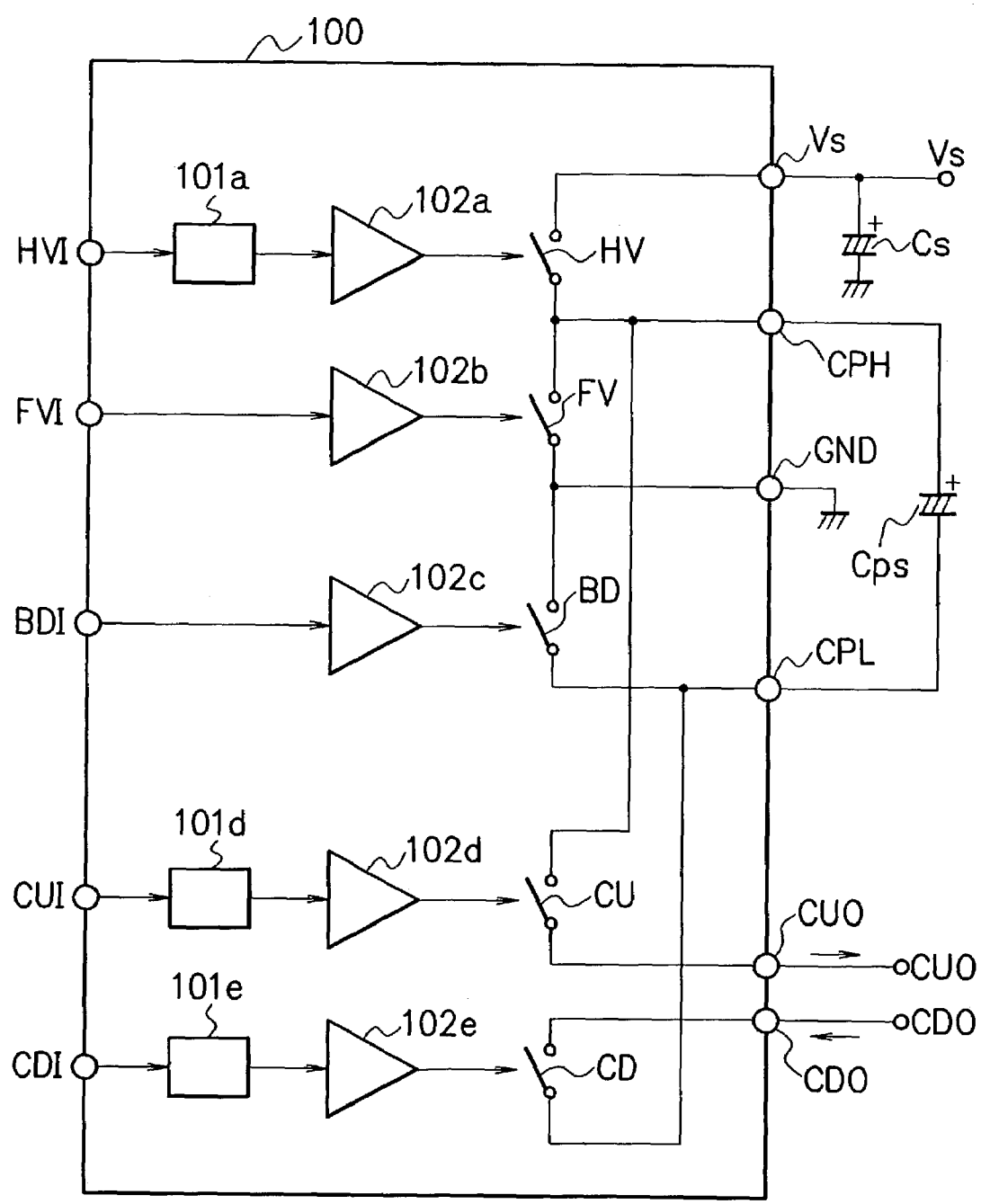
FIG. 1 is a principle diagram of a power module according to a first embodiment of the present invention.

FIG. 1 shows a principle diagram of a power module 100 according to the first embodiment of the present invention. In FIG. 1, a first switch HV, a second switch FV, a third switch BD, a fourth switch CU, and a fifth switch CD respectively correspond to switches SWA, SWB, SWC, SWD and SWE in the circuit described in FIG. 2 in page 1237 of SID 01 DIGEST.

The power module 100 has a power-supply voltage terminal Vs for inputting a positive power-supply (for example, 100 V), a ground terminal GND, a first voltage terminal CPH, a second voltage terminal CPL, a third voltage terminal CUO, and a fourth voltage terminal CDO, and further has the following inner configuration. Control signals for controlling the first to the fifth switch HV, FV, BD, CU and CD are inputted to a first to a fifth control signal terminal HVI, FVI, BDI, CUI and CDI, respectively. A first, a fourth, and a fifth signal level conversion circuit 101a, 101d and 101e convert levels of control signals inputted through the first, the fourth, and the fifth control signal terminal HVI, CUI and CDI respectively. The signal level conversion circuits 101a, 101d and 101e are explained later in detail with reference to FIG. 2. A first, a fourth, and a fifth pre-drive circuit 102a, 102d and 102e are amplification circuits for amplifying control signals inputted from the signal level conversion circuits 101a, 101d and 101e respectively. A second and a third pre-drive circuit 102b and 102c are amplification circuits for amplifying control signals inputted through the control signal terminals FVI and BDI respectively. The opening and closing of the first to the fifth switch HV, FV, BD, CU and CD are controlled in accordance with control signals outputted from the first to the fifth amplification circuit 102a to 102e respectively.

The first switch HV is connected between the power-supply voltage terminal Vs and the first voltage terminal CPH. The second switch FV is connected between the first voltage terminal CPH and the ground terminal GND. The third switch BD is connected between the second voltage terminal CPL and the ground terminal GND. The fourth switch CU is connected between the first voltage terminal CPH and the third voltage terminal CUO. The fifth switch CD is connected between the second voltage terminal CPL and the fourth voltage terminal CDO.

Next, an external circuit of the power module 100 is explained. A positive power-supply voltage is inputted to the power-supply voltage terminal Vs, and a ground potential is supplied to the ground terminal GND. A capacitor Cs is connected between the power-supply voltage terminal Vs and the ground terminal GND. A capacitor CPS is connected between the first voltage terminal CPH and the second voltage terminal CPL.

Figure 2:
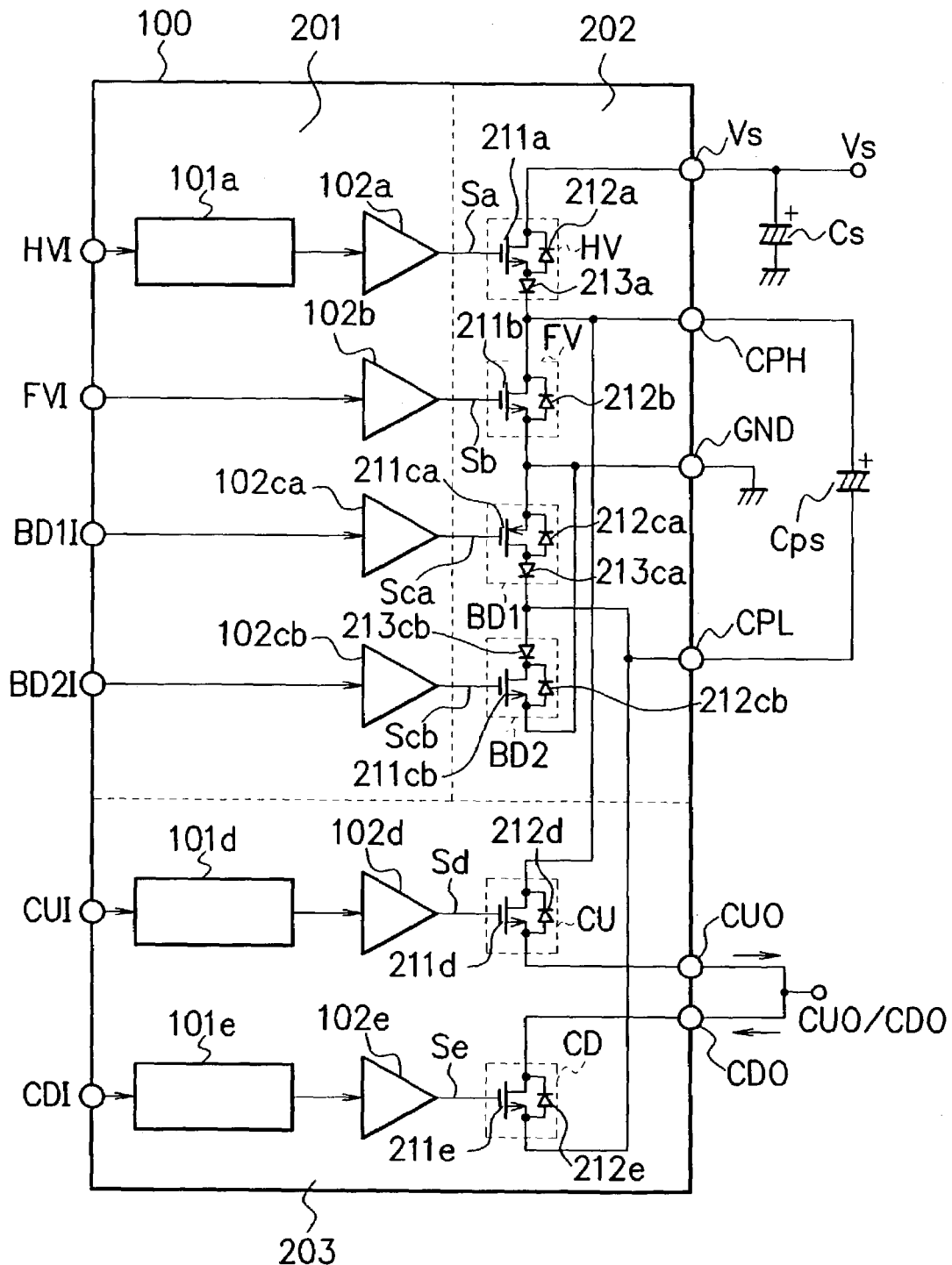
FIG. 2 is a view showing a first specific example of the power module of the first embodiment.

FIG. 2 shows a first specific example of the power module shown in FIG. 1. The switch HV has an n-channel power MOSFET (metal-oxide-semiconductor field effect transistor) 211a, a parasitic diode 212a, and a diode 213a. The FET 211a has a gate connected to the output of the pre-drive circuit 102a and a drain connected to the power-supply voltage terminal Vs. The parasitic diode 212a has an anode connected to a source of the FET 211a and a cathode connected to the drain of the FET 211a. The diode 213a has an anode connected to the source of the FET 211a and a cathode connected to the voltage terminal CPH.

The voltage at the terminal CPH connected to the source of the FET 211a changes, as in FIG. 3 explained later, to the power-supply voltage (Vs) or ground. Since the reference potential of the source of the FET 211a changes, the level of the gate thereof also needs to be changed in accordance with the change. The signal level conversion circuit 101a is a circuit for changing the level of the gate.

The switch FV has an n-channel power MOSFET 211b and a parasitic diode 212b. The FET 211b has a gate connected to the output of the pre-drive circuit 102b, a source connected to the ground terminal GND, and a drain connected to the voltage terminal CPH. The parasitic diode 212b has an anode connected to the source of the FET 211b and a cathode connected to the drain of the FET 211b.

Switches BD1 and BD2 correspond to the switch BD in FIG. 1. The switch BD forms a bilateral switch using both the switch BD1 including a p-channel power MOSFET 211ca and the switch BD2 including an n-channel power MOSFET 211cb.

Pre-drive circuits 102ca and 102cb correspond to the pre-drive circuit 102c in FIG. 1. Control signal terminals BD1I and BD2I correspond to the control signal terminal BDI in FIG. 1. The pre-drive circuits 102ca and 102cb are amplification circuits which amplify control signals inputted through the control signal terminals BD1I and BD2I respectively.

The switch BD1 has the p-channel power MOSFET 211ca, a parasitic diode 212ca, and a diode 213ca. The FET 211ca has a gate connected to the output of the pre-drive circuit 102ca and a source connected the ground terminal GND. The parasitic diode 212ca has an anode connected to a drain of the FET 211ca and a cathode connected to the source of the FET 211ca. The diode 213ca has an anode connected to the drain of the FET 211ca and a cathode connected to the voltage terminal CPL.

The switch BD2 has the n-channel power MOSFET 211cb, a parasitic diode 212cb, and a diode 213cb. The FET 211cb has a gate connected to the output of the pre-drive circuit 102cb and a source connected to the ground terminal GND. The parasitic diode 212cb has an anode connected to the source of the FET 211cb and a cathode connected to a drain of the FET 211cb. The diode 213cb has an anode connected to the voltage terminal CPL and a cathode connected to the drain of the FET 211cb.

The switch CU has an n-channel power MOSFET 211d and a parasitic diode 212d. The FET 211d has a gate connected to the output of the pre-drive circuit 102d, a source connected to the voltage terminal CUO, and a drain connected to the voltage terminal CPH. The parasitic diode 212d has an anode connected to the source of the FET 211d and a cathode connected to the drain of the FET 211d.

It should be noted that the voltage at the terminal CUO connected to the source of the FET 211d changes, as in FIG. 3 explained later, to the positive power-supply voltage (Vs), ground, or a negative power-supply voltage (–Vs). Since the reference potential of the source of the FET 211d changes, the level of the gate thereof also needs to be changed in accordance with the change. The signal level conversion circuit 101d is a circuit for changing the level of the gate.

The switch CD has an n-channel power MOSFET 211e and a parasitic diode 212e. The FET 211e has a gate connected to the output of the pre-drive circuit 102e, a source connected to the voltage terminal CPL, and a drain connected to the voltage terminal CDO. The parasitic diode 212e has an anode connected to the source of the FET 211e and a cathode connected to the drain of the FET 211e. The voltage terminals CUO and CDO are connected to each other outside the module.

Note that the voltage at the terminal CPL connected to the source of the FET 211e changes, as in FIG. 3 explained later, to the negative power-supply voltage (–Vs) or ground. Since the reference potential of the source of the FET 211e changes, the level of the gate thereof also needs to be changed in accordance with the change. The signal level conversion circuit 101e is a circuit for changing the level of the gate.

Figure 3:
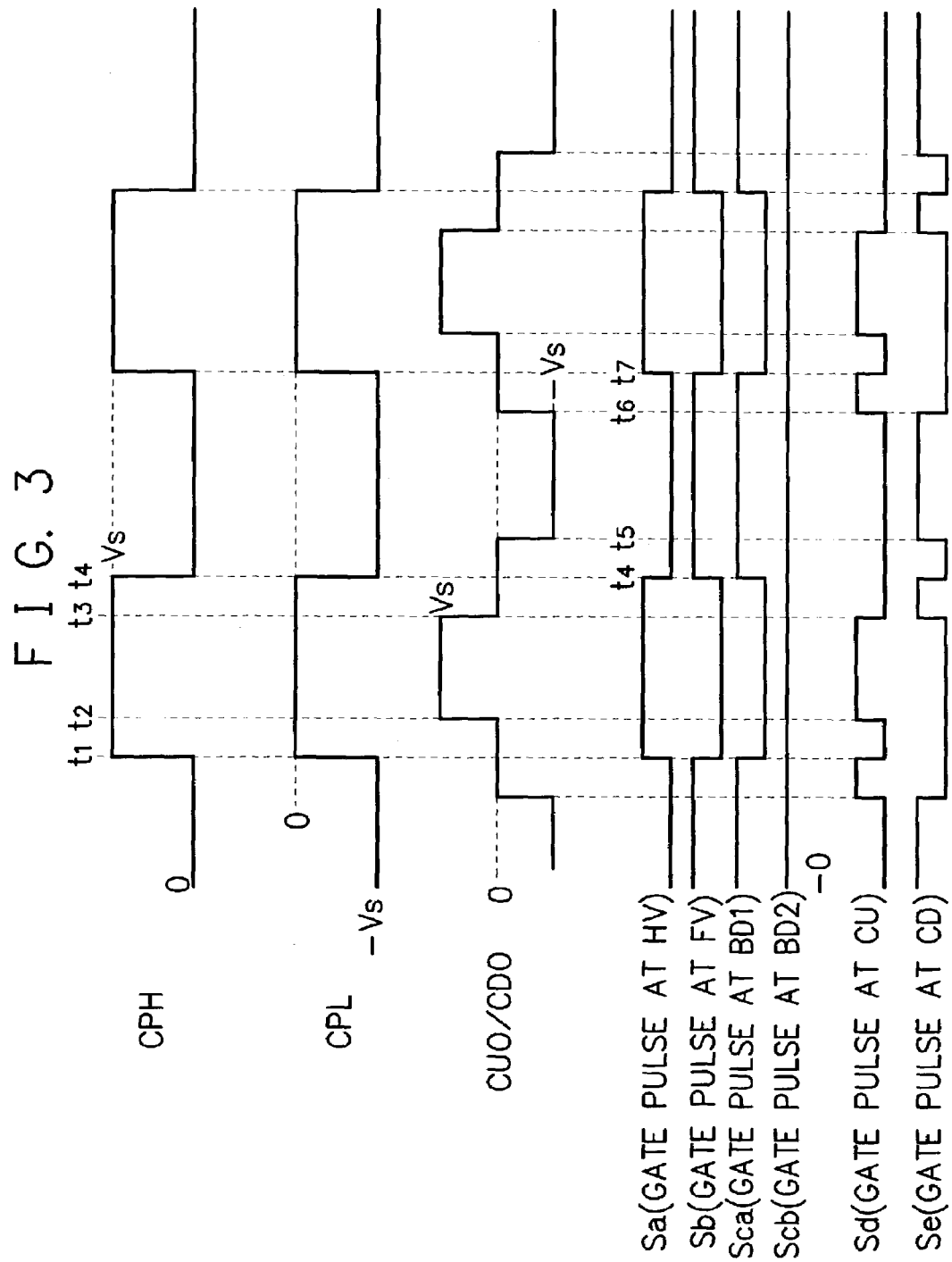
FIG. 3 is a chart showing an operating waveform of the power module of the first embodiment.

FIG. 3 is an operating waveform chart showing the operation of the power module shown in FIG. 2. In this chart, control signal lines Sa, Sb, Sca, Scb, Sd and Se are control signal lines (gate lines) of the switches HV, FV, BD1, BD2, CU and CD in FIG. 2 respectively.

In this operation, the switch BD2 is always in an ON state. The switch BD1 has the p-channel power MOSFET 211ca and thus turns into a conducting state at a low level. The other switches have n-channel power MOSFETs and thus turn into a conducting state at a high level.

(1) At time t1, the switches FV and CU turn off and the switches HV and BD1 turn on. In this event, the switch BD2 is in an ON state, and the switch CD is in an OFF state. As a result, the capacitor CPS is charged from the power-supply voltage terminal Vs through the switch HV. The voltage at the voltage terminal CPH accordingly becomes the power-supply voltage (Vs).

(2) At time t2, the switch CU turns on from the state of (1) to output electric charges which have been charged on the capacitor CPS and the capacitor Cs through the output voltage terminal CUO. Accordingly, the output voltage terminal CUO/CDO is clamped at the power-supply voltage (Vs).

(3) At time t3, the switch CU turns off and the switch CD turns on from the state of (2). In this event, a sink current flows from the output terminal CDO through the switches CD and BD2, so that the output voltage terminal CUO/CDO is clamped at ground.

(4) At time t4, the switch HV and the switch BD1 turn off from the state of (3), and then the switch FV turns on. As a result, the voltage at the voltage terminal CPH becomes ground, and the voltage at the voltage terminal CPL at the other end of the capacitor CPS becomes the negative power-supply voltage (–Vs). In this event, the switch CD is turned off, so that the output voltage terminal CUO/CDO remains at ground.

(5) At time t5, the switch CD is turned on from the state of (4). As a result, the output voltage terminal CUO/CDO is clamped at the negative power-supply voltage (–Vs).

(6) At time t6, the switch CD is turned off and the switch CU is turned on from the state of (5). As a result, the output voltage terminal CUO/CDO is clamped at ground.

(7) At time t7, the switches FV and CU are turned off, and the switches HV and BD1 are turned on from the state of (6), and then the operation returns to the above-described (1).

To normally output the operating waveforms of the output voltage terminals CUO and CDO, it is necessary to accurately set the operation timing of each of the switches. For example, in the above-described operation (1), it is necessary that the switch HV turns on after the switch FV turns off. In the case of the reversed order to the above, the switch HV and the switch FV turn on at the same time, so that shoot-through current may flow through them, resulting in a fault. Also in the other operations (2) to (7), it is important to accurately set the operation timings of the above-described switches.

Meanwhile, the pre-drive circuit for supplying a gate pulse to the above-described switch has an input-output delay time tIO, which changes depending on a surrounding temperature Ta. The pre-drive circuit is constituted by an IC or the like, so that the relationship between the input-output delay time tIO and the surrounding temperature Ta may exhibit characteristics as shown in FIG. 16. A conceivable cause of such a relationship is influence by temperature characteristics of parts (resistors, transistors, diodes and so on) in the IC which constitute the above-described pre-drive circuit.

When the circuit described in FIG. 2 in page 1237 of SID 01 DIGEST is realized using the pre-drive circuit having such characteristics, the surrounding temperature Ta of the pre-drive circuit needs to be considered. For example, when pre-drive circuits are arranged on a printed board, the design needs to take into consideration that their operation timings remain normal even when their input-output delay times tIO become different from each other due to the difference in the surrounding temperature Ta.

Figure 4:
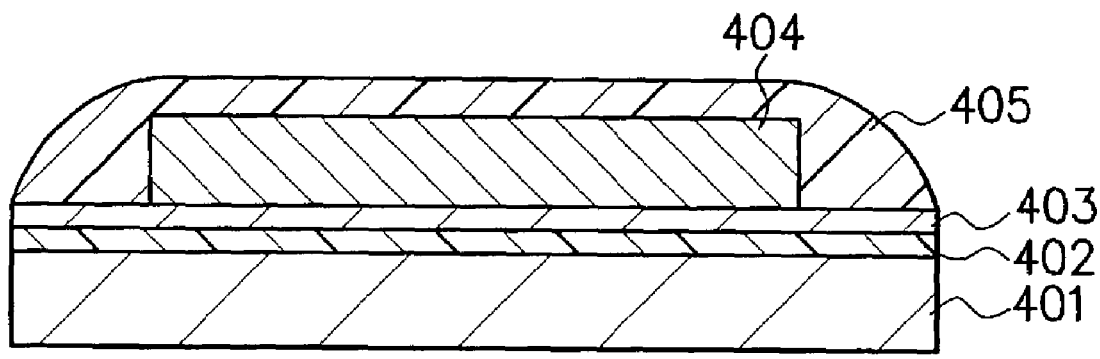
FIG. 4 is a cross-sectional view of the power module.

FIG. 4 is a cross-sectional view of the power module 100 in FIG. 2. In the power module of this embodiment, the above-described pre-drive circuits can be arranged on the same metal substrate. On a metal substrate (for example, an aluminum substrate) 401, a semiconductor chip 404 is formed through an insulating layer 402 and a wiring layer 403 made of copper foil. The semiconductor chip 404 has a circuit configuration in FIG. 2 and is covered with a resin 405.

As a result, the difference in the surrounding temperature Ta among the pre-drive circuits, can be decreased. This makes it possible to reduce variations in the above-described input-output delay times tIO due to the surrounding temperatures Ta.

Therefore, it is possible to decrease changes in the operation timings of the pre-drive circuits shown in FIG. 2 due to their surrounding temperatures so as to keep margins of the operation timings appropriate. Consequently, the reliability of the circuit shown in FIG. 2 can further be improved.

As shown in FIG. 1, a case has been described in which the switch HV, the switch FV, the switch BD, the switch CU, and the switch CD, and their pre-drive circuits are contained in the power module. In the above-described circuit, even when only the pre-drive circuits are contained in the power module, the reliability can be improved. Further, even when only the switch HV, the switch FV, and the switch BD for forming the negative power-supply voltage (−Vs), and their pre-drive circuits are contained in this power module, the reliability can be improved.

In short, all of the circuits shown in FIG. 2 do not always need to be provided on the same metal substrate. The operation timing needs to be more highly accurate for the switches HV, FV and BD than for the switches CU and CD. Therefore, when the semiconductor module 100 is divided into a first region 201, a second region 202, and a third region 203, only the first and the second region 201 and 202 may be provided on the same metal substrate. The first region 201 here includes the pre-drive circuits 102a, 102b, 102ca, and 102cb. The second region 202 includes the switches HV, FV, BD1 and BD2.

Further, the variations in the input-output delay times tIO due to the surrounding temperatures Ta are greatly influenced particularly by the pre-drive circuits. Therefore, only the first region 201 including the pre-drive circuits 102a, 102b, 102ca and 102cb may be provided on the same metal substrate.

Furthermore, the power module may be provided on a ceramic substrate instead of being provided on the metal substrate. As compared to a printed board, a metal substrate and a ceramic substrate are excellent in heat conductivity and thus capable of making the surrounding temperatures Ta uniform. In particular, a metal substrate is more excellent in heat conductivity than a ceramic substrate, and thus it is preferable to use a metal substrate.

Figure 5:
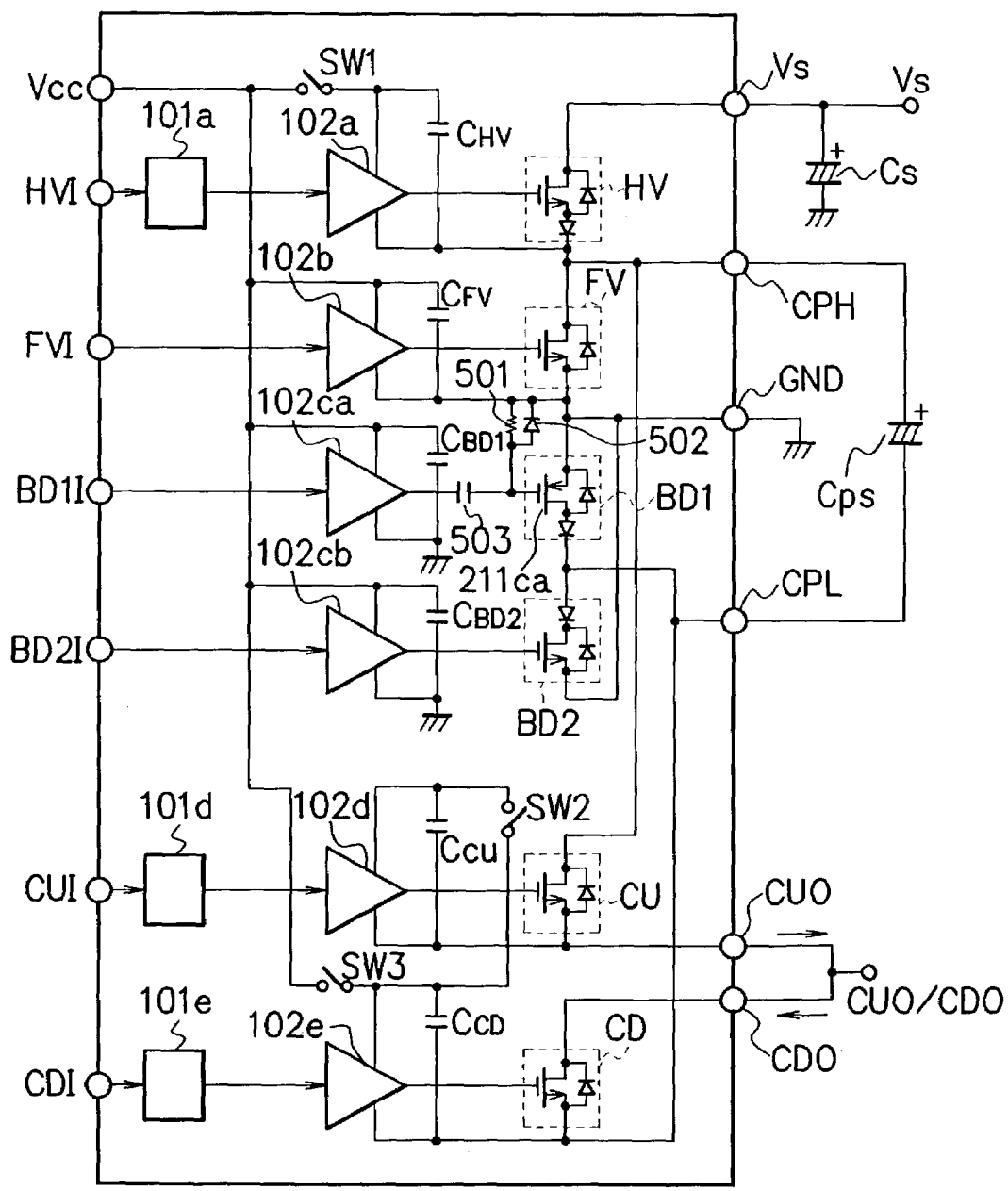
FIG. 5 is a view showing a second specific example of the power module of the first embodiment.

FIG. 5 shows a second specific example of the power module according to this embodiment. The points differing from the power module in FIG. 2 will be explained. An amplification circuit power-supply voltage for driving the pre-drive circuits 102a, 102b, 102ca, 102cb, 102d and 102e, is inputted to an amplification circuit power-supply voltage terminal Vcc. Capacitors CHV, CFV, CBD1, CBD2, CCU and CCD are connected between power-supply voltage terminals and reference voltage terminals of the pre-drive circuits 102a, 102b, 102ca, 102cb, 102d and 102e respectively, to be able to supply stable power-supply voltages to the respective pre-drive circuits.

A first amplification circuit switch SW1 is connected between the power-supply voltage terminal Vcc and the power-supply voltage terminal of the first amplification circuit 102a. A second amplification circuit switch SW2 is connected between the power-supply voltage terminal of the fourth amplification circuit 102d and the power-supply voltage terminal of the fifth amplification circuit 102e. A third amplification circuit switch SW3 is connected between the power-supply voltage terminal Vcc and the power-supply voltage terminal of the fifth amplification circuit 102e. The power-supply voltage terminals of the pre-drive circuits 102b, 102ca and 102cb are directly connected to the power-supply voltage terminal Vcc. The reference voltage terminals of the pre-drive circuits 102a, 102b, 102ca, 102cb, 102d and 102e are connected to terminals CPH, GND, GND, GND, CUO and CPL respectively.

A capacitor 503 is connected between the output of the pre-drive circuit 102ca and the gate of the FET 211ca. A resistor 501 is connected between the gate of the FET 211ca and the ground terminal GND. A diode 502 has an anode connected to the gate of the FET 211ca and a cathode connected to the ground terminal GND.

The above-described switches SW1, SW2 and SW3 are constituted using semiconductor switches such as diodes, transistors or the like. The switch SW1 turns on when the voltage terminal CPH (the source voltage of the switch HV) is at ground, and turns off when the terminal is at the power-supply voltage (Vs). When the switch SW1 turns on, the capacitor CHV is charged to the power-supply voltage (Vcc) thereacross.

The switch SW3 turns on when the voltage terminal CPL (the source voltage of the switch CD) is at ground, and turns off when the terminal is at the negative power-supply voltage (−Vs). When the switch SW3 turns on, the capacitor CCD is charged to the power-supply voltage (Vcc) thereacross.

The switch SW2 turns on when the terminal CUO/CDO (the source voltage of the switch CU) is at the negative power-supply voltage (−Vs), and turns off when the terminal is at the positive power-supply voltage (Vs) and at ground. When the switch SW2 turns on, the switch SW3 turns off, so that the capacitor CCU is charged to the power-supply voltage (Vcc) thereacross.

Figure 6:
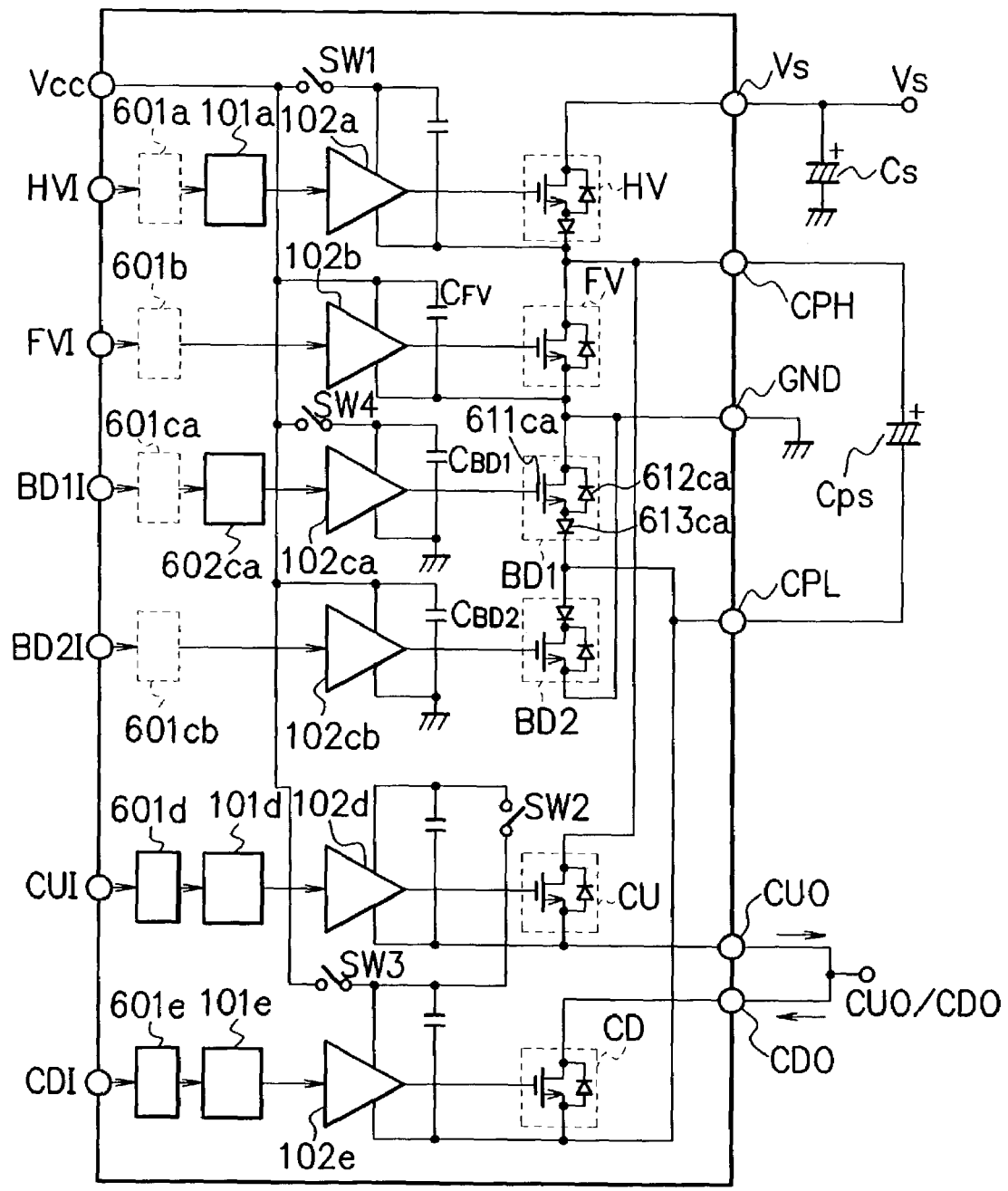
FIG. 6 is a view showing a third specific example of the power module of the first embodiment.

FIG. 6 shows a third specific example of the power module according to this embodiment. For the switch BD1, an n-channel power MOSFET 611ca is used in place of the p-channel power MOSFET. Generally, the n-channel power MOSFET can decrease in on-resistance more than the p-channel MOSFET for the same chip area. Therefore, in this example, the voltage drop can be reduced when a current flows more than in the example using the above-described p-channel power MOSFET 211ca shown in FIG. 2 and FIG. 5.

The switch BD1 has the FET 611ca, a parasitic diode 612ca, and a diode 613ca. The FET 611ca has a gate connected to the output of the pre-drive circuit 102ca and a drain connected to the ground terminal GND. The parasitic diode 612ca has an anode connected to a source of the FET 611ca and a cathode connected to the drain of the FET 611ca. The diode 613ca has an anode connected to the source of the FET 611ca and a cathode connected to the voltage terminal CPL.

A signal level conversion circuit 602ca is provided between the control signal terminal BD1I and the pre-drive circuit 102ca. The voltage at the terminal CPL connected to the source of the FET 611ca changes, as shown in FIG. 3, to the negative power-supply voltage (−Vs) or ground. Since the reference potential of the source of the FET 611a changes, the level of the gate thereof also needs to be changed in accordance with the change. The signal level conversion circuit 602ca is a circuit for changing the level of the gate.

The switch SW4 is added when the above-described n-channel power MOSFET 611ca is used, and connected between the power-supply voltage terminal Vcc and the power-supply voltage terminal of the pre-drive circuit 102ca. The resistor 501, diode 502 and capacitor 503 in FIG. 5 are unnecessary. The switch SW4 turns on when the voltage terminal CPL (the source voltage of the switch BD1) is at ground, and turns off when the terminal at the negative power-supply voltage (−Vs). When the switch SW4 turns on, the capacitor CBD1 is charged to the power-supply voltage (Vcc) thereacross.

Input-output delay time adjustment circuits 601d and 601e are connected between the control signal terminals CUI and CDI and the pre-drive circuits 101d and 101e respectively to adjust input-output delay times corresponding to differences between moments of rising edges of control signals, which drive the switches CU and CD, at the terminals CUI and CDI, and points of times when the switches CU and CD turn on, respectively. The input-output delay time adjustment circuits 601d and 601e can adjust the variations in delay amounts which are generated by the variations in the delay times of the pre-drive circuits 102d and 102e and the variations in input capacitances (gate-source capacitances) and output capacitances (drain-source capacitances) of the switches CU and CD. Consequently, the operation timings of the switches can be set more accurately, so that the reliability of the circuit can further be improved.

Further, by providing, in a similar manner, input-output delay time adjustment circuits 601a, 601b, 601ca and 601cb immediately after the terminals HVI, FVI, BD1I and BD2I for the control signals for driving the switch HV, the switch FV, the switch BD1 and the switch BD2, the accuracy of the operation timings of the switching elements can further be improved.

Figure 7A:
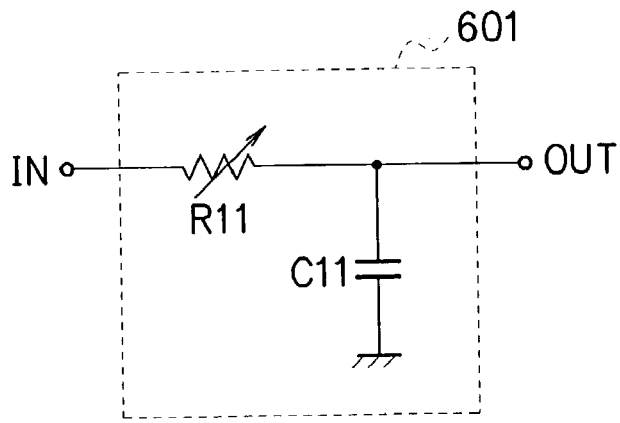
FIGS. 7A to 7C are views each showing a configuration example of an input-output delay time adjustment circuit.

FIG. 7A shows a configuration example of the above-described input-output delay time adjustment circuit. An input-output delay time adjustment circuit 601 has a variable resistor R11 and a capacitor C11. The variable resistor R11 is connected between an input terminal IN and an output terminal OUT. The capacitor C11 is connected between the output terminal OUT and the ground terminal GND. By changing the resistance value of the variable resistor R11, the input-output delay time can be adjusted.

Figure 7B:
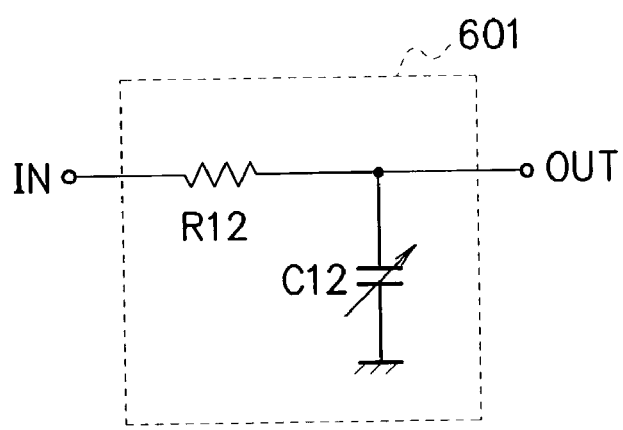

FIG. 7B shows another configuration example of the above-described input-output delay time adjustment circuit. An input-output delay time adjustment circuit 601 has a resistor R12 and a variable capacitor C12. The resistor R12 is connected between an input terminal IN and an output terminal OUT. The variable capacitor C12 is connected between the output terminal OUT and the ground terminal GND. By changing the capacitance value of the variable capacitor C12, the input-output delay time can be adjusted.

Figure 7C:
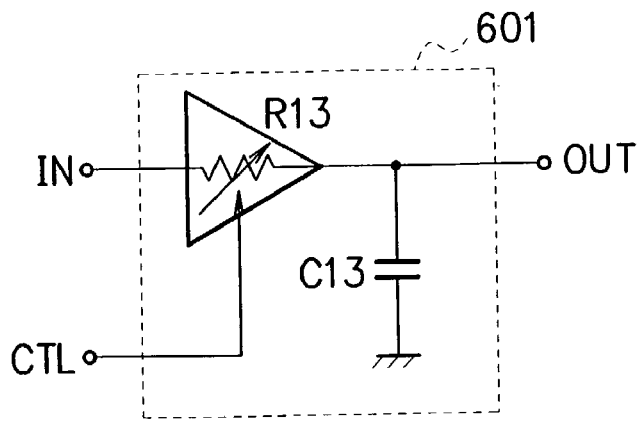

FIG. 7C shows still another configuration example of the above-described input-output delay time adjustment circuit. An input-output delay time adjustment circuit 601 has an electronic volume R13 and a capacitor C13. The electronic volume R13 is connected between an input terminal IN and an output terminal OUT. The capacitor C13 is connected between the output terminal OUT and the ground terminal GND. By inputting a control signal into a control terminal CTL of the electronic volume R13, the resistance value of the electronic volume R13 is changed, so that the input-output delay time can be adjusted.

Figure 8:
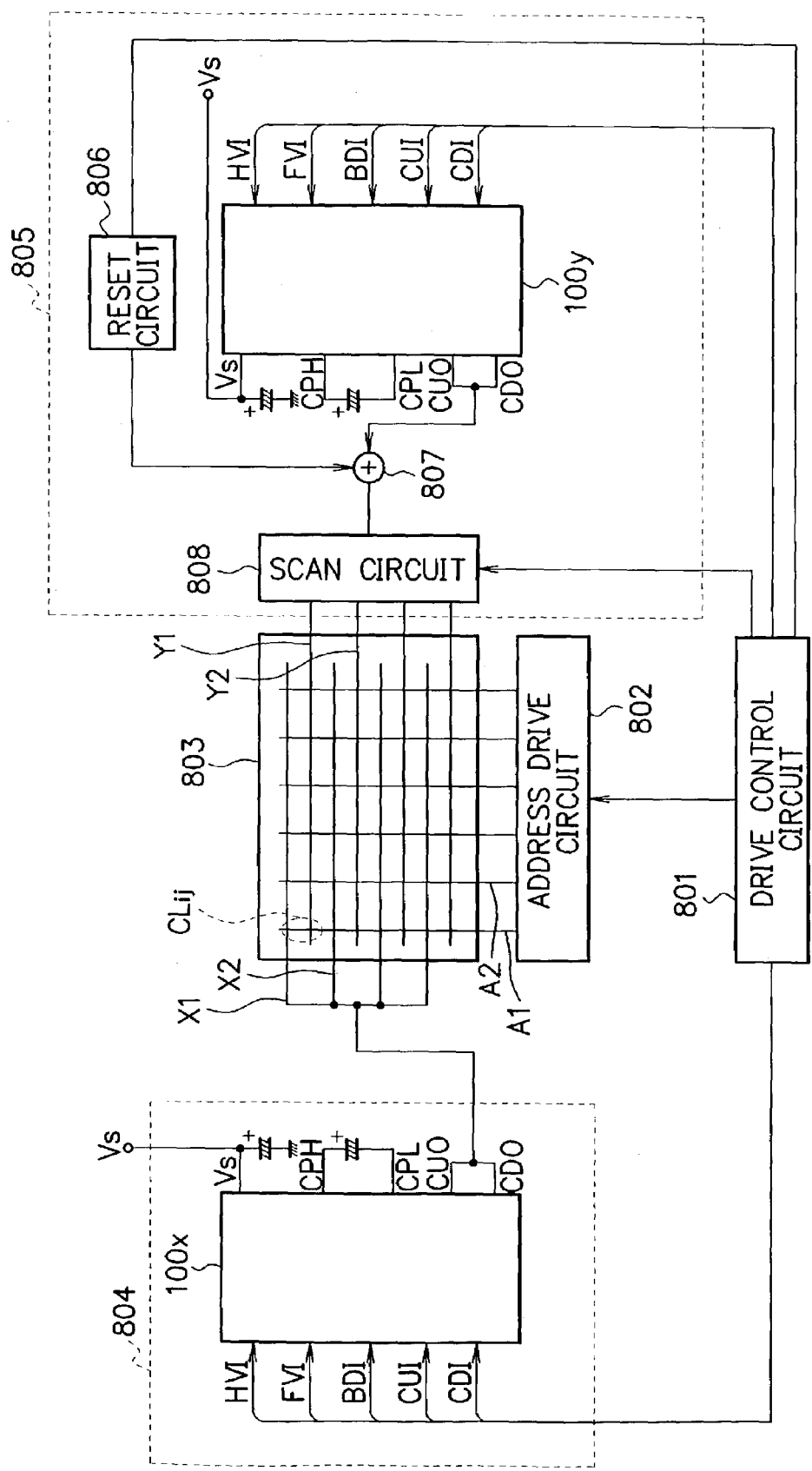
FIG. 8 is a view showing a plasma display device including the power module according to the first embodiment.

FIG. 8 shows a plasma display device of the progressive system using the power module according to this embodiment. In this plasma display device, two pieces of the power module 100, which is shown in FIG. 2, are used as power modules 100x and 100y. A drive control circuit 801 outputs control signals to the control signal terminals HVI, FVI, BDI, CUI and CDI of the power modules 100x and 100y. Further, the drive control circuit 801 outputs control signals to an address drive circuit 802, a scan circuit 808, and a reset circuit 806.

An X drive circuit 804 has the power module 100x. An output terminal CUO/CDO of the power module 100x is connected to X electrodes X1, X2 and so on in common. A Y drive circuit 805 has the power module 100y, the reset circuit 806, an adding circuit 807, and the scan circuit 808. The adding circuit 807 adds a signal from an output terminal CUO/CDO of the power module 100y and an output signal from the reset circuit 806 and outputs the resultant signal to the scan circuit 808. The scan circuit 808 outputs a signal, based on the added signal, to Y electrodes Y1, Y2 and so on in response to the control signal. The address drive circuit 802 outputs a signal to address electrodes A1, A2 and so on in response to the control signal.

In a plasma display panel (PDP) 803, the X electrodes X1, X2 and so on and the Y electrodes Y1, Y2 and so on are alternately arranged, and the address electrodes A1, A2 and so on run in a direction perpendicular to them to form a two-dimensional matrix. Each display cell (pixel) CLij is constituted by one X electrode, one Y electrode, and one address electrode.

Figure 9A:
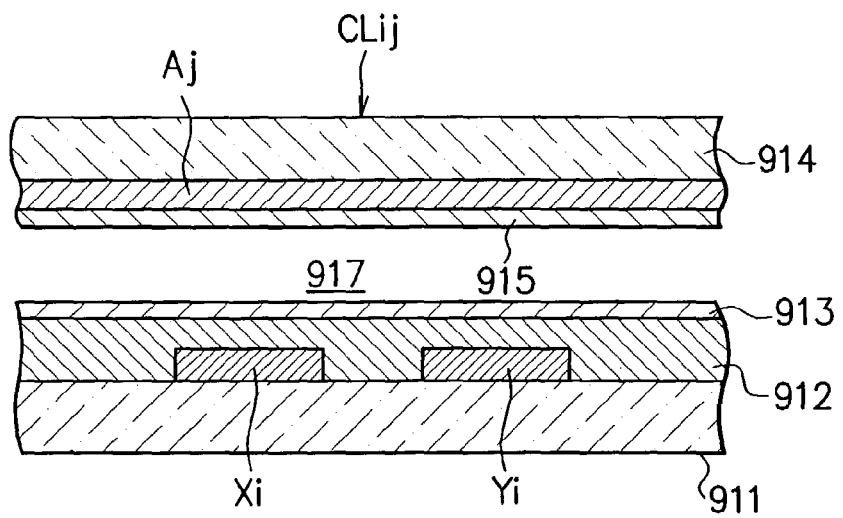
FIGS. 9A to 9C are views each showing a display cell.

FIG. 9A is a view showing a configuration of a cross section of the display cell CLij in FIG. 8. An X electrode Xi and a Y electrode Yi are formed on a front glass substrate 911. A dielectric layer 912 for insulating the electrodes from a discharge space 917 is applied thereover, and a MgO (magnesium oxide) protective film 913 is further applied over the dielectric layer 912.

An address electrode Aj is formed on a back glass substrate 914 which is disposed to oppose the front glass substrate 911, a dielectric layer 915 is applied thereover, and further a phosphor is applied over the dielectric layer 915. In the discharge space 917 between the MgO protective film 913 and the dielectric layer 915, a Ne+Xe Penning gas or the like is sealed.

Figure 9B:
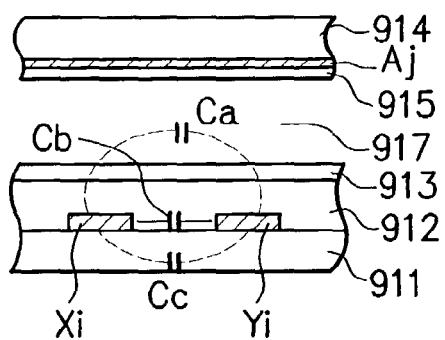

FIG. 9B is a view for explaining a capacitance Cp of an AC drive type plasma display. A capacitance Ca is a capacitance of the discharge space 917 between the X electrode Xi and the Y electrode Yi. A capacitance Cb is a capacitance of the dielectric layer 912 between the X electrode Xi and the Y electrode Yi. A capacitance Cc is a capacitance of the front glass substrate 911 between the X electrode Xi and the Y electrode Yi. The sum of the capacitances Ca, Cb and Cc determines the capacitance between the electrodes Xi and Yi.

Figure 9C:
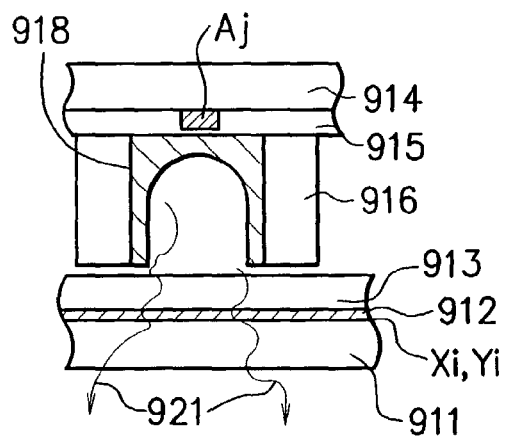

FIG. 9C is a view for explaining luminescence of the AC drive type plasma display. On an inner surface of a rib 916, phosphors 918 in red, blue and green are applied, arranged in stripes for each color, so that discharge between the X electrode Xi and the Y electrode Yi excites the phosphor 918 to generate light 921.

FIG. 10 is a cross-sectional view of the progressive system plasma display panel 803 in FIG. 8. On a glass substrate 1001, a display cell of an X electrode Xn−1 and a Y electrodes Yn−1, a display cell of an X electrode Xn and a Y electrode Yn, and a display cell of an X electrode Xn+1 and a Y electrode Yn+1, are formed. Between the display cells, light shields 1003 are provided. An insulating layer 1002 is provided to cover the light shields 1003 and the electrodes Xi and Yi.

Under an address electrode 1007, an insulating layer 1006 and a phosphor 1005 are provided. A discharge space 1004 is provided between the insulating layer 1002 and the phosphor 1005, and a Ne+Xe Penning gas or the like is sealed in the discharge space 1004. Discharged light in the display cell is reflected by the phosphor 1005 and passes through the glass substrate 1001 to be displayed.

In the progressive system, the gap between the electrodes Xn−1 and Yn−1, the gap between the electrodes Xn and Yn, and the gap between the electrodes Xn+1 and Yn+1, the respective pairs of electrodes constituting display cells, are small, so that discharge can be performed in the gaps. Meanwhile, the gap between the electrodes Yn−1 and Xn and the gap between the electrodes Yn and Xn+1, the gaps existing between different display cells, are large, so that discharge is not performed in the gaps.

Figure 11:
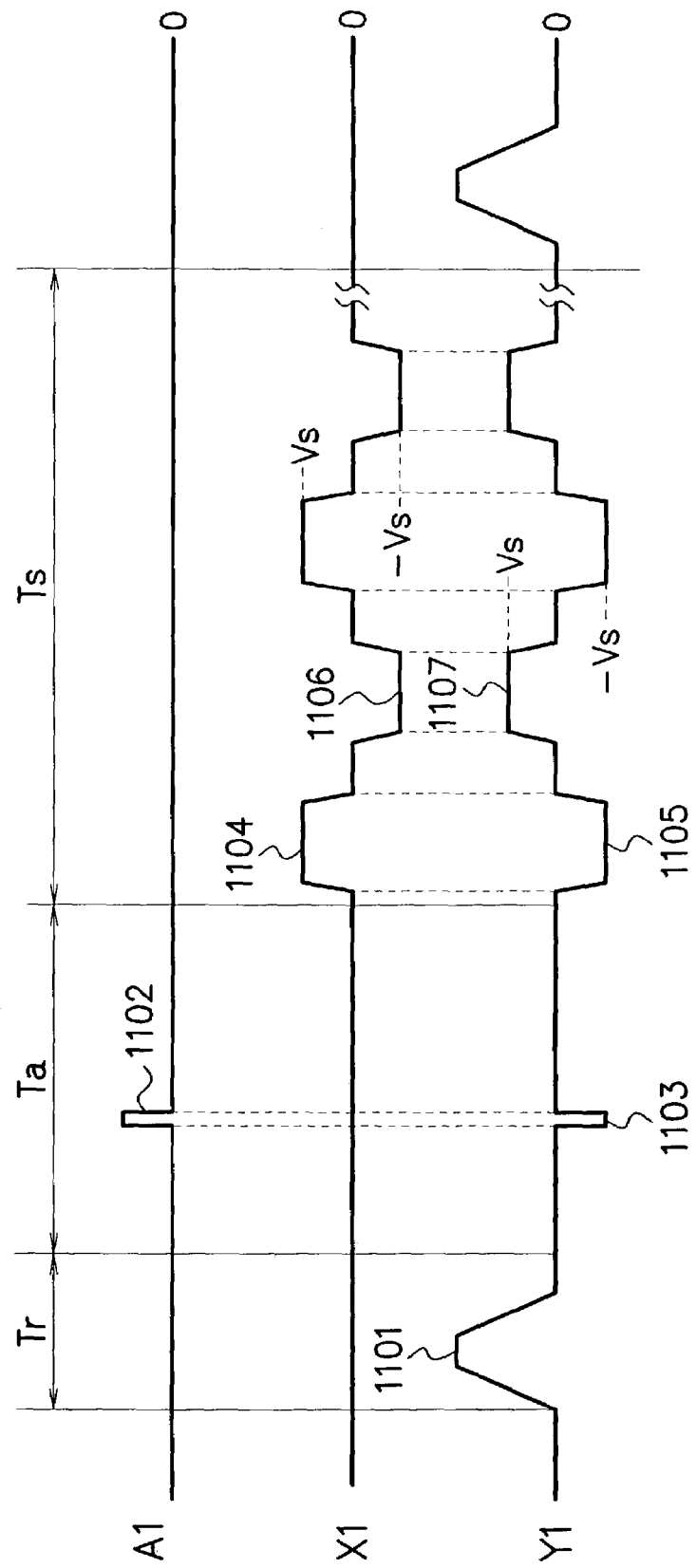
FIG. 11 is a chart showing an operating waveform in the plasma display device.

FIG. 11 is an operating waveform chart of the plasma display device in FIG. 8. The power module 100x in the X drive circuit 804 outputs to the X electrode X1 and so on X sustain pulses 1104 and 1106 and so on which are generated during a sustain period Ts. The power module 100y in the Y drive circuit 805 outputs to the Y electrode Y1 and so on Y sustain pulses 1105 and 1107 and so on which are generated during the sustain period Ts. The reset circuit 806 in the Y drive circuit 805 outputs to the Y electrode Y1 and so on a reset pulse 1101 which is generated during a reset period Tr. The scan circuit 808 in the Y drive circuit 805 outputs to the Y electrode Y1 and so on a scan pulse 1103 which is generated during an address period Ta. The address drive circuit 802 outputs to the address electrode A1 and so on an address pulse 1102 which is generated during the address period Ta.

During the reset period Tr, the reset pulse 1101 is applied to the Y electrode Yi to perform an entire write and an entire erase of electric charges, thereby erasing previous display contents and forming a predetermined wall charge.

Then, during the address period Ta, the positive potential pulse 1102 is applied to the address electrode A1 and the negative potential pulse 1103 is applied to a desired Y electrode Yi by a sequential scan. This causes address discharge between the address electrode Aj and the Y electrode Yi to address a display cell.

Subsequently, during the sustain period (sustaining discharge period) Ts, the voltages 1104 and 1105 having opposite phases and the voltages 1106 and 1107 having opposite phases are respectively applied to the X electrodes Xi and the Y electrodes Yi to conduct sustaining discharge between the X electrode Xi and the Y electrode Yi which are associated with the display cell addressed during the address period Ta for luminescence.

Note that during the sustain period Ts, a waveform shown in FIG. 12 is also adoptable. In this case, voltage waveforms at the X electrode and the Y electrode change to ground or a double power-supply voltage (2×Vs). In both FIG. 11 and FIG. 12, the potential difference between the X electrode and the Y electrode is a double power-supply voltage (2×Vs). In the waveform in FIG. 12, an element in the power module needs a withstand voltage of the double power-supply voltage (2×Vs) while, in the waveform in FIG. 11, an element in the power module needs a withstand voltage of only the power-supply voltage (Vs).

However, as compared to the waveform in FIG. 12, there are twice rising edges and falling edges during one sustain cycle in the waveform in FIG. 11. This corresponds to doubling the frequency. For this reason, it is important problem to adequately assure the operation timing of the above waveform. In other words, the above-described input-output delay time needs to be adjusted with high accuracy. Since the input-output delay time depends on the surrounding temperature as shown in FIG. 16, the surrounding temperature can be made uniform by modularizing a power-supply circuit as in this embodiment, so that the variations in the input-output delay times can be decreased.

Further, in the waveform in FIG. 11, as compared to the waveform in FIG. 12, since the voltage is halved, the electric power is reduced to a quarter, and since the number (frequency) of rising edges and falling edges of the waveform is doubled, the electric power is doubled. As a whole, the electric power is halved.

The use of the plasma display device of this embodiment enables use of an element with a low withstand voltage that is a characteristic of the power module shown in FIG. 1 as well as reduction in driving power therefor. In addition, the variations in the operation timings of the elements due to the surrounding temperatures can be decreased, so that the reliability of the circuit can be improved.

Second Embodiment

Figure 13:
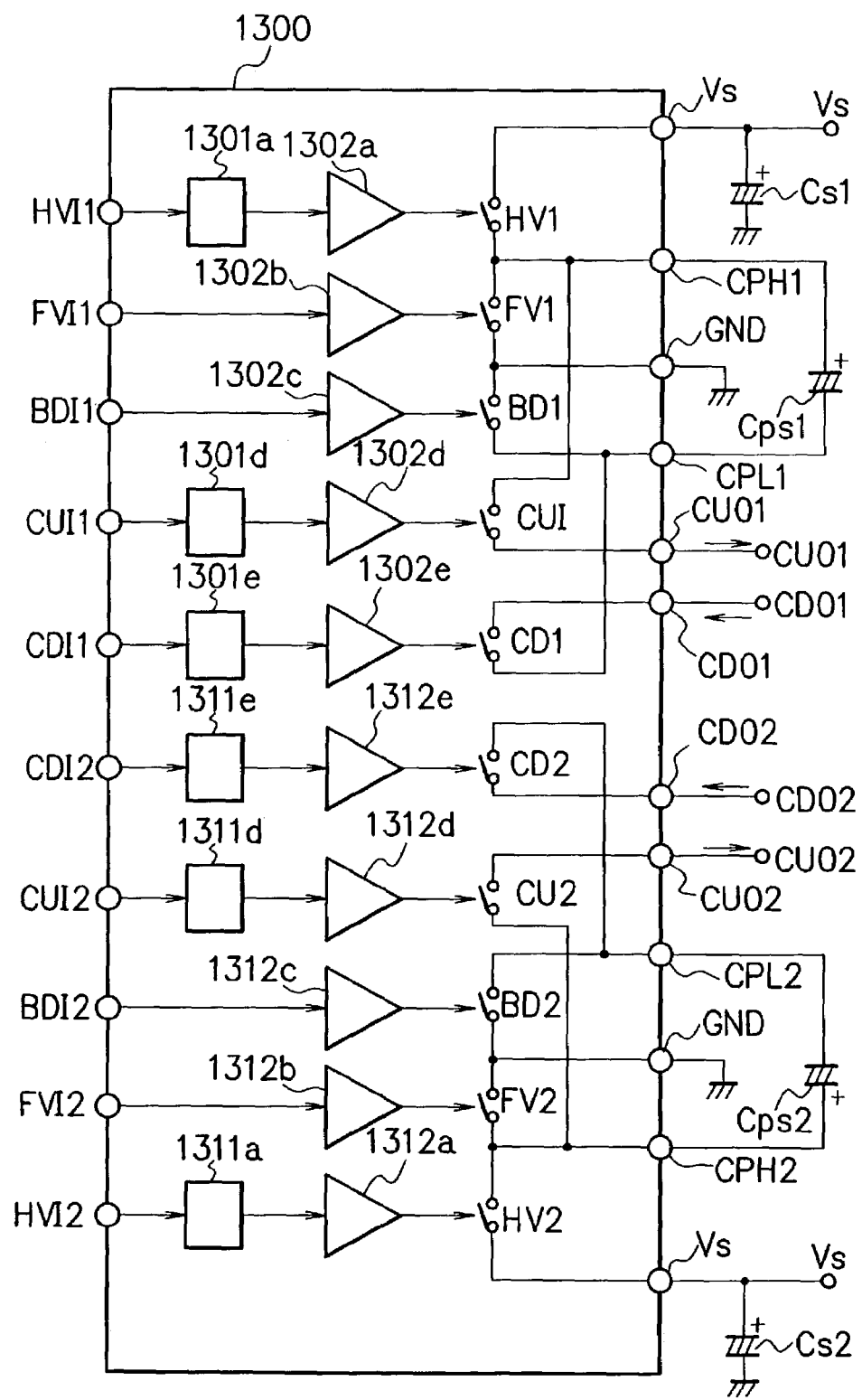
FIG. 13 is a principle diagram of a power module according to a second embodiment of the present invention.

FIG. 13 shows a power module 1300 according to the second embodiment of the present invention. The power module 1300 is characterized by containing therein two pieces of the power module 100 shown in FIG. 1 for two channels. More specifically, the power module 1300 has a first switching circuit and a second switching circuit, each switching circuit constituting the circuit configuration of the power module shown in FIG. 1.

Further, in the power module 1300, input and output terminals are provided in a vertically symmetric manner. As a result, wirings of input and output parts of a substrate in which the power module 1300 is applied can be provided in a vertically symmetrical manner. This can reduce the difference between the channels in voltage drop (voltage change caused by discharge current and wiring impedance) caused by the difference in impedance of wiring pattern. Therefore, deterioration in image quality caused by the difference in the above-described voltage drop can be reduced in the plasma display device. This power module 1300 is also provided, similarly to the first embodiment, on one metal substrate or ceramic substrate.

Figure 14:
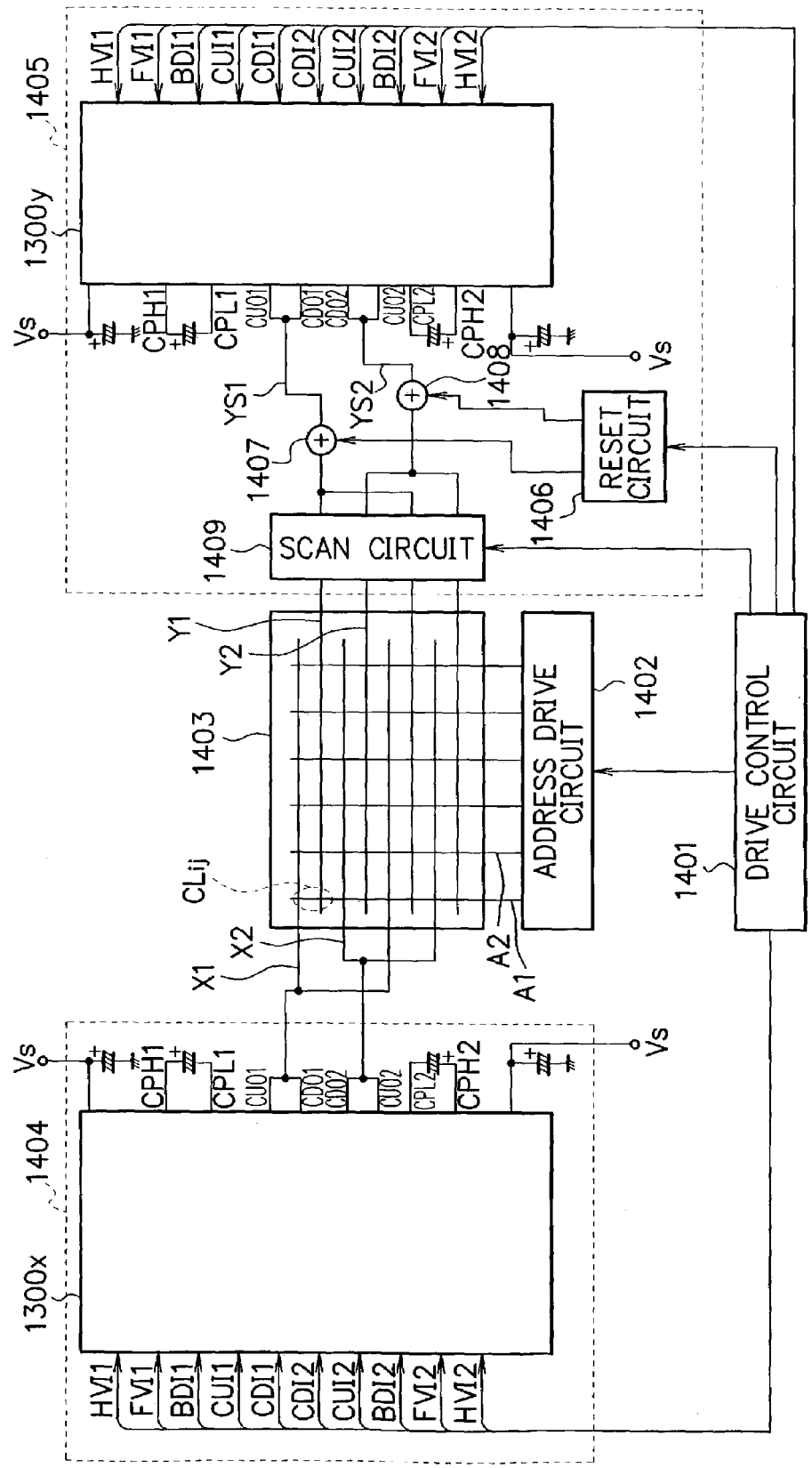
FIG. 14 is a view showing a plasma display device including the power module according to the second embodiment.

FIG. 14 shows a plasma display device of the ALIS (Alternate Lighting of Surfaces) system in which the power module 1300 shown in FIG. 13 is applied. In this plasma display device, two pieces of the power module 1300, which is shown in FIG. 13, are used as power modules 1300x and 1300y. A drive control circuit 1401 outputs control signals to control signal terminals HVI1, FVI1, BDI1, CUI1, CDI1 and so on of the power modules 1300x and 1300y. Further, the drive control circuit 1401 outputs control signals to an address drive circuit 1402, a scan circuit 1409, and a reset circuit 1406.

The X drive circuit 1404 has the power module 1300x. The power module 1300x has a first channel output terminal CUO1/CDO1 connected to odd-numbered X electrodes X1 and so on in common and a second channel output terminal CUO2/CDO2 connected to even-numbered X electrodes X2 and so on in common. A Y drive circuit 1405 has the power module 1300y, the reset circuit 1406, adding circuits 1407 and 1408, and the scan circuit 1409. The adding circuit 1407 adds a signal YS1 from a first channel output terminal CUO1/CDO1 of the power module 1300y and an output signal from the reset circuit 1406 and outputs the resultant signal to the scan circuit 1409. The adding circuit 1408 adds a signal YS2 from a second channel output terminal CUO2/CDO2 of the power module 1300y and the output signal from the reset circuit 1406 and output the resultant signal to the scan circuit 1409. The scan circuit 1409 outputs a signal, based on those added signals, to Y electrodes Y1, Y2 and so on in response to the control signal. The address drive circuit 1402 outputs a signal to address electrodes A1, A2 and so on in response to the control signal.

In a PDP 1403, the X electrodes X1, X2 and so on and the Y electrodes Y1, Y2 and so on are alternately arranged, and the address electrodes A1, A2 and so on run in a direction perpendicular to them to form a two-dimensional matrix. Each display cell CLij is constituted by one X electrode, one Y electrode, and one address electrode.

Figure 15:
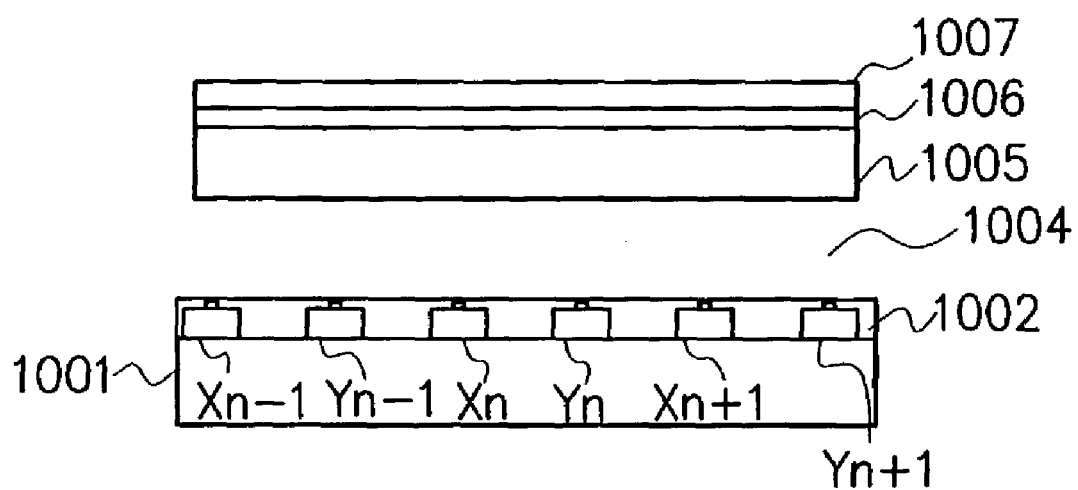
FIG. 15 is a view showing a plasma display panel of the ALIS system.

FIG. 15 is a cross-sectional view of the ALIS system plasma display panel 1403 in FIG. 14. This configuration is basically the same as that of the progressive system plasma display panel in FIG. 10. However, in the ALIS system, all of the gaps between the electrodes Xn−1, Yn−1, Xn, Yn, Xn+1 and Yn+1 are the same, and there is no shield 1003 therebetween. It is assumed that the gap between the electrodes Xn−1 and Yn−1, the gap between the electrodes Xn and Yn, and the gap between the electrodes Xn+1 and Yn+1 are first slits respectively, and the gap between the electrodes Yn−1 and Xn and the gap between the electrodes Yn and Xn+1 are second slits. In the ALIS system, sustaining discharge in the first slits is conducted during a first frame period, and sustaining discharge in the second slits is conducted during a second frame period following the first frame period. According to the ALIS system, the number of display lines (rows) is twice that of the progressive system, thus realizing high accuracy.

In the progressive system, the signals on odd-numbered X electrodes and even-numbered X electrodes are in phase, and the signals on odd-numbered Y electrodes and even-numbered Y electrodes are in phase in the sustain period Ts in FIG. 11.

In the ALIS system, the signals on odd-numbered X electrodes and even-numbered X electrodes are in opposite phases, and the signals on odd-numbered Y electrodes and even-numbered Y electrodes are in opposite phases in the sustain period Ts. In FIG. 14, the ALIS system plasma display device is configured to apply different voltages to the odd-numbered X electrode X1 and so on and the even-numbered X electrode X2 and so on respectively. For example, the ALIS system can be applied which is described in Japanese Patent Laid-Open No. H9-160525 (Japanese Patent Application No. H8-194320).

Each of the power modules 1300x and 1300y in FIG. 14 contains therein the first switching circuit for driving odd-numbered electrodes and the second switching circuit for driving even-numbered electrodes. In the first switching circuits for the odd-numbered electrodes of the above-describe power modules, sustain pulses to be supplied to the odd-numbered X and Y electrodes are formed based on the drive control signals which are supplied from the drive control circuit 1401. In the second switching circuits for the even-numbered electrodes of the above-describe power modules 1300x and 1300y, sustain pulses to be supplied to the even-numbered X and Y electrodes are formed based on the drive control signals which are supplied from the drive control circuit 1401.

The plasma display device shown in FIG. 14 can improve the reliability when the odd-numbered electrodes and the even-numbered electrodes are individually driven (when outputs of equal to or more than two channels are required), in addition to the effects in the plasma display device shown in FIG. 8. Further, with the plasma display device shown in FIG. 14, the changes in phases (delay times) of the sustain pulses, which are applied to the odd-numbered electrodes and even-numbered electrodes, with respect to the changes in the surrounding temperatures can be decreased. This provides an effect of reducing deterioration in image quality of the plasma display device caused by the aforesaid phase changes.

It should be noted that an IGBT (insulated gate bipolar transistor) may be used in place of the aforesaid power MOSFET.

In the first and second embodiments, the switching elements such as the power MOSFETs, IGBTs or the like which are used as the above-described switches SWA, SWB, SWC, SWD and SWE and the pre-drive circuits for driving the switching elements are mounted in one power module. As a result, it is possible to reduce the difference in the surrounding temperature among the pre-drive circuits which drive the switches SWA, SWB, SWC, SWD and SWE so as to decrease the difference in the input-output delay time among them.

Further, in the first and second embodiments, the switching elements such as the power MOSFETs, IGBTs or the like which are used as the switches SWA, SWB and SWC for forming the negative power-supply voltage (−Vs) and the pre-drive circuits for driving the switching elements are mounted in one power module. As a result, it is possible to reduce the difference in the surrounding temperature among the pre-drive circuits which drive the switches SWA, SWB and SWC so as to decrease the difference in the input-output delay time among them.

Consequently, in the operation of the aforementioned circuit described in FIG. 2 in page 1237 of SID 01 DIGEST, it is possible to decrease changes in the operation timings of the switching elements due to their surrounding temperatures so as to keep margins of their operation timings appropriate. Therefore, the reliability of the circuit can further be improved.

Further, by providing in the power module an input-output delay amount adjustment circuit which adjusts the delay amount between an input voltage and an output voltage, the operation timings of the switching elements can be set more accurately, so that the reliability of the circuit can further be improved.

It should be noted that there is no description, in the aforementioned Japanese Patent Laid-Open No. 2000-89724, on the pre-drive circuit for driving the above-described switches SWA, SWB and SWC which are the characteristics of the first and second embodiments.

As described above, the use of the first and second embodiments makes it possible to decrease changes in the operation timings of the switching elements due to their surrounding temperatures so as to keep margins of their operation timings appropriate in the aforementioned circuit described in FIG. 2 in page 1237 of SID 01 DIGEST (a circuit capable of decreasing voltage rating and power consumption of output switching elements). Therefore, the reliability of the circuit can further be improved.

Third Embodiment

Figure 17:
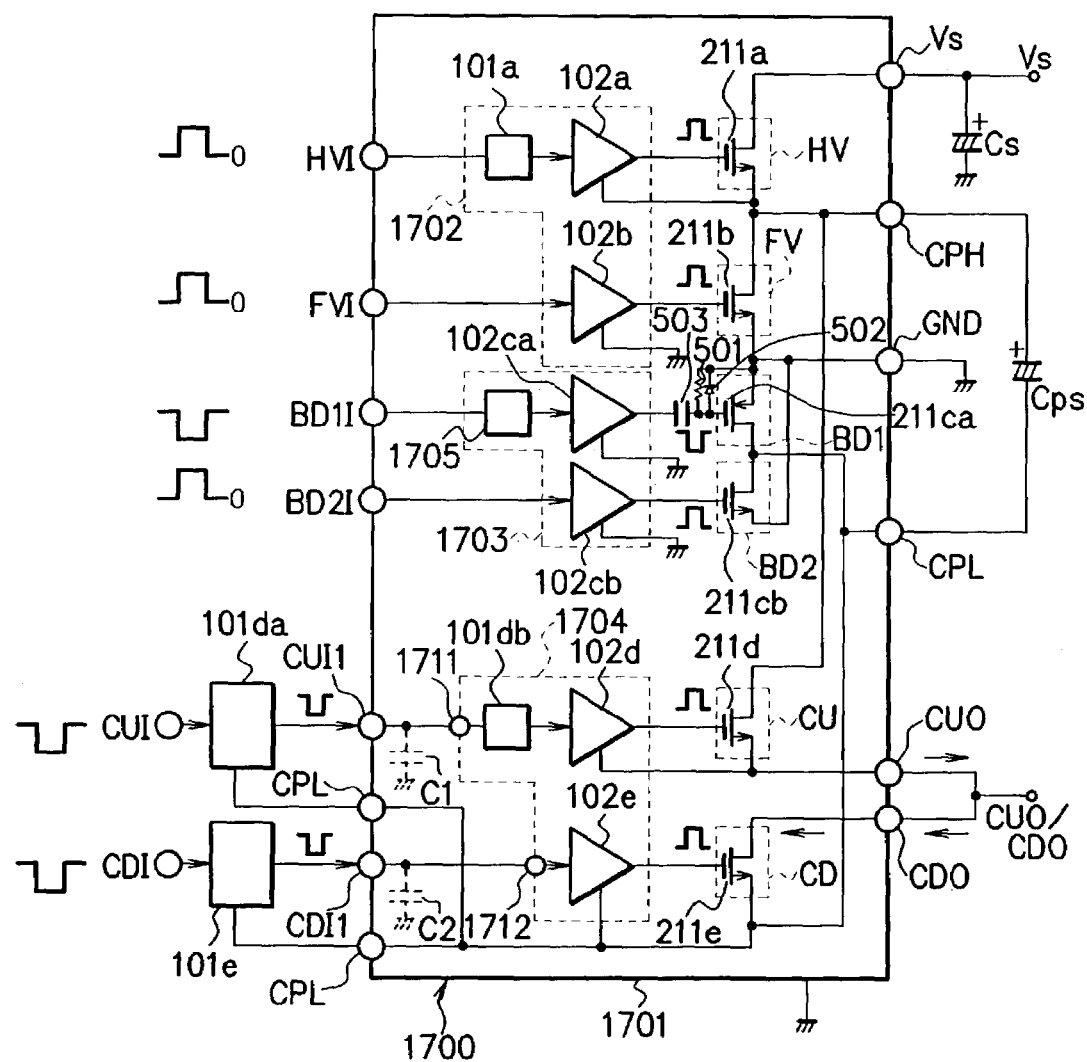
FIG. 17 is a view showing a power module and external circuits according to a third embodiment of the present invention.

FIG. 17 shows a power module 1700 and external circuits 101da, 101e, and so on according to the third embodiment of the present invention. The power module 1700 is basically the same as the power module 100 in FIG. 2, and thus only different points therebetween are explained. Signal level conversion circuits 101*da* and 101*db* correspond to the signal level conversion circuit 101*d* in FIG. 2. The signal level conversion circuit 101*da* converts in level a signal using the ground as a reference which is inputted to a control signal terminal CUI into a signal using the voltage at a terminal CPL as a reference, and outputs it to a terminal CUI1. The signal level conversion circuit 101*db* converts in level the signal inputted to the terminal CUI1 into a signal using the voltage at a terminal CUO as a reference, and outputs it to an amplification circuit 102*d*. The signal level conversion circuits 101*da* and 101*e* are circuits which convert signals into those using the voltage at the terminal CPL as a reference. Since the voltage at the terminal CPL becomes a negative voltage −Vs as shown in FIG. 3, it is difficult to form the signal level conversion circuits 101*da* and 101*e* on a monolithic IC (integrated circuit). Hence, the signal level conversion circuits 101*da* and 101*e* are designed to be external circuits using a photocoupler. Since the photocoupler is susceptible to heat, the signal conversion circuits 101*da* and 101*e* are designed not to be formed on a metal substrate 1701 but to be external circuits, thereby making it possible to prevent the circuits from being affected by heat generated by a switch HV and so on.

Other signal level conversion circuit 101*a* and 101*db* are formed in ICs 1702 and 1704, respectively. The IC 1702 has amplification circuits 102*a* and 102*b* in addition to the signal level conversion circuit 101*a*. The IC 1704 has amplification circuits 102*d* and 102*e* in addition to the signal level conversion circuit 101*db*. An IC 1703 has a signal level conversion circuit 1705 and amplification circuits 102*ca* and 102*cb*. The three ICs 1702 to 1704 have the same configuration and thus identical ICs can be used for them. It should be noted that the signal level conversion circuit 1705 is provided between a control signal terminal BD1I and an input of the amplification circuit 102*ca* and does not conduct substantial signal level conversion. Besides, the configurations of a resistor 501, a diode 502, and a capacitor 503 are the same as those in FIG. 5.

The power module 1700 has the external terminals CUI1, CPL, CDI1, and CPL, in place of the external terminals CUI and CDI in FIG. 2. The signal level conversion circuit 101*da* has an input terminal connected to the terminal CUI, an output terminal connected to the terminal CUI1, and a reference terminal connected to the terminal CPL. The terminal CUI1 is connected to a terminal 1711 of the IC 1704. The signal level conversion circuit 101*db* has an input terminal connected to the terminal 1711 and an output terminal connected to an input terminal of the amplification circuit 102*d*.

The signal level conversion circuit 101*e* has an input terminal connected to a terminal CDI, an output terminal connected to the terminal CDI1, and a power-supply terminal connected to the terminal CPL. The terminal CDI1 is connected to an input terminal of the amplification circuit 102*e* through a terminal 1712 of the IC 1704. It should be noted that the IC 1704 is configured such that the signal at the terminal 1711 and the gate signal of a FET 211*d* are logically inverted, and the signal at the terminal 1712 and the gate signal at a FET 211*e* are logically inverted.

The module 1700 is formed on the metal substrate 1701 such as aluminum or the like as in the above-described embodiments. The use of the metal substrate 1701 enables efficient release of heat generated by the switch HV and so on and the amplification circuit 102*a* and so on. The metal substrate 1701 is connected to the ground terminal GND. A capacitor C1 is a parasitic capacitance (stray capacitance) existing between a wiring between the terminal CUI1 and the terminal 1711 and the metal substrate (ground) 1701, and the signal using the voltage at the terminal CPL as a reference is applied to the wiring. Besides, a capacitance C2 is a parasitic capacitance existing between a wiring between the terminal CDI1 and the terminal 1712 and the metal substrate (ground) 1701, and the signal using the voltage at the terminal CPL as a reference is applied to the wiring. Integration circuits respectively constituted of the parasitic capacitances C1 and C2, output impedances of the signal level conversion circuits 101*da* and 101*e*, and so on cause noise as described later referring to FIG. 19. Note that since the signal using the ground as a reference is applied to wirings of control signal terminals HVI, FVI, BD1I, and BD2I, noise due to the parasitic capacitances causes no problem. Further, there is no problem of noise at stages after FETs 211*a* to 211*e* because of low impedances. In contrast to this, there occurs noise by the integration circuits including the parasitic capacitance C1 or C2 because of high impedances at stages before the FETs 211*a* to 211*e*.

Figure 18A:
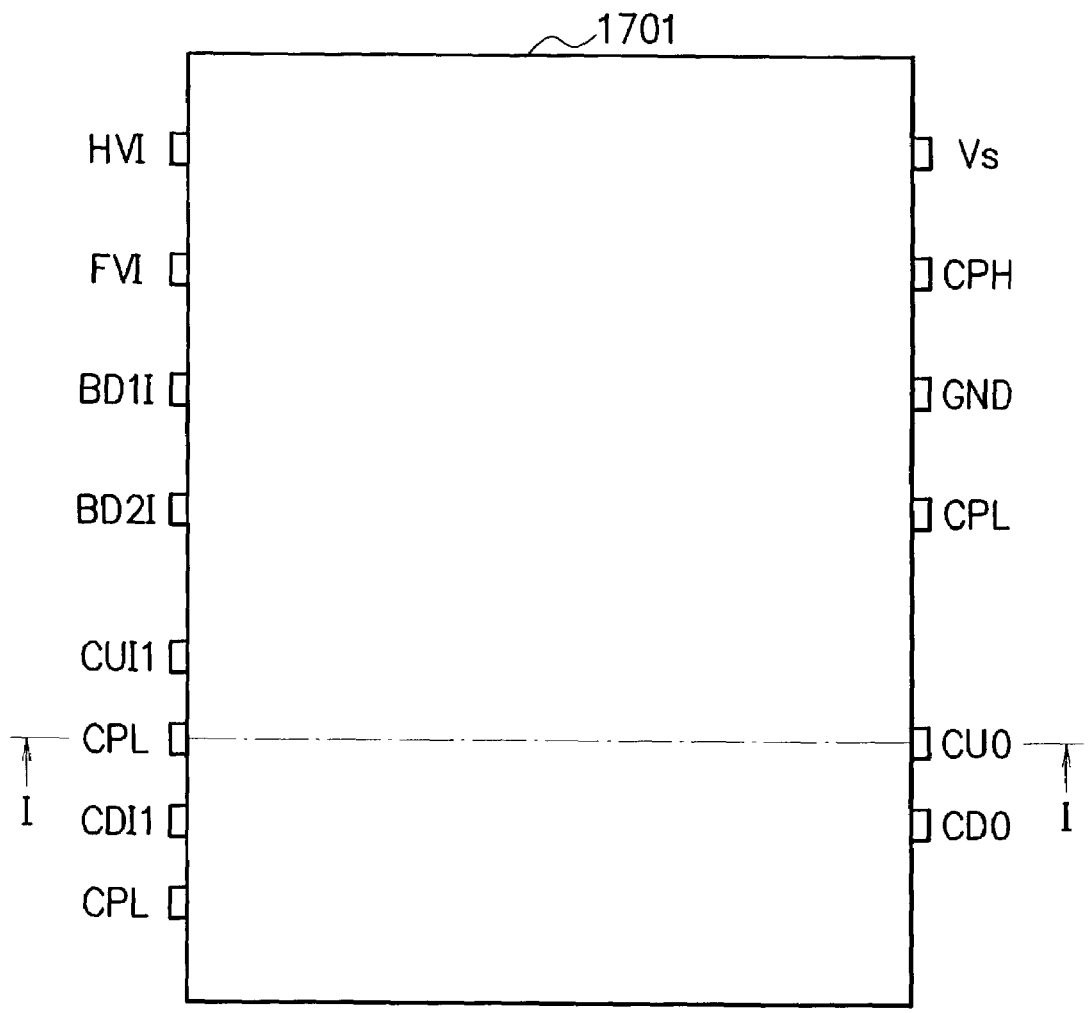
FIG. 18A is a top view of the power module in FIG. 17.
Figure 18B:
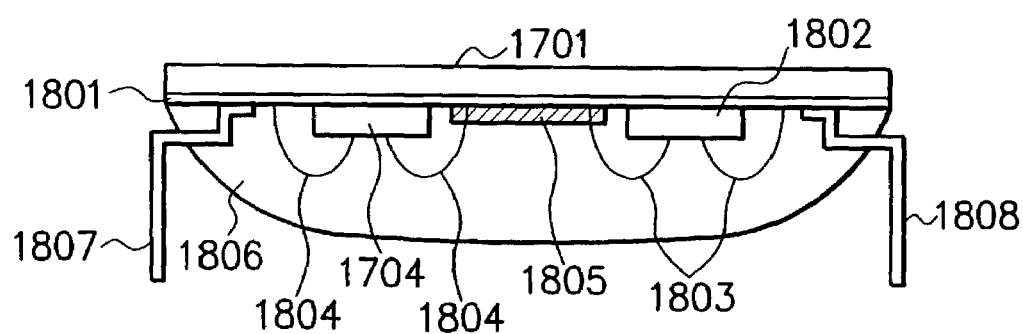
FIG. 18B is a cross-sectional view taken along a line I—I in FIG. 18A.

FIG. 18A is a top view of the power module 1700 in FIG. 17, and FIG. 18B is a cross-sectional view taken along a line I—I in FIG. 18A. A lower face of the metal substrate 1701 is provided with IC chips 1704 and 1802 and a wiring 1805 through an insulator 1801. The IC chip 1802 includes the switches HV, FV, BD1, BD2, CU, and CD, and bonding wires 1803 are connected to the IC chip 1802. To the IC chip 1704, bonding wires 1804 are connected. The wiring 1805 is formed of, for example, a copper foil pattern, and the boding wires 1803 and 1804 and so on are connected thereto. An IC pin (lead) 1807 corresponds to the terminal CPL, and an IC pin 1808 corresponds to the terminal CUO. The power module 1700 is molded with a resin 1806.

Figure 19:
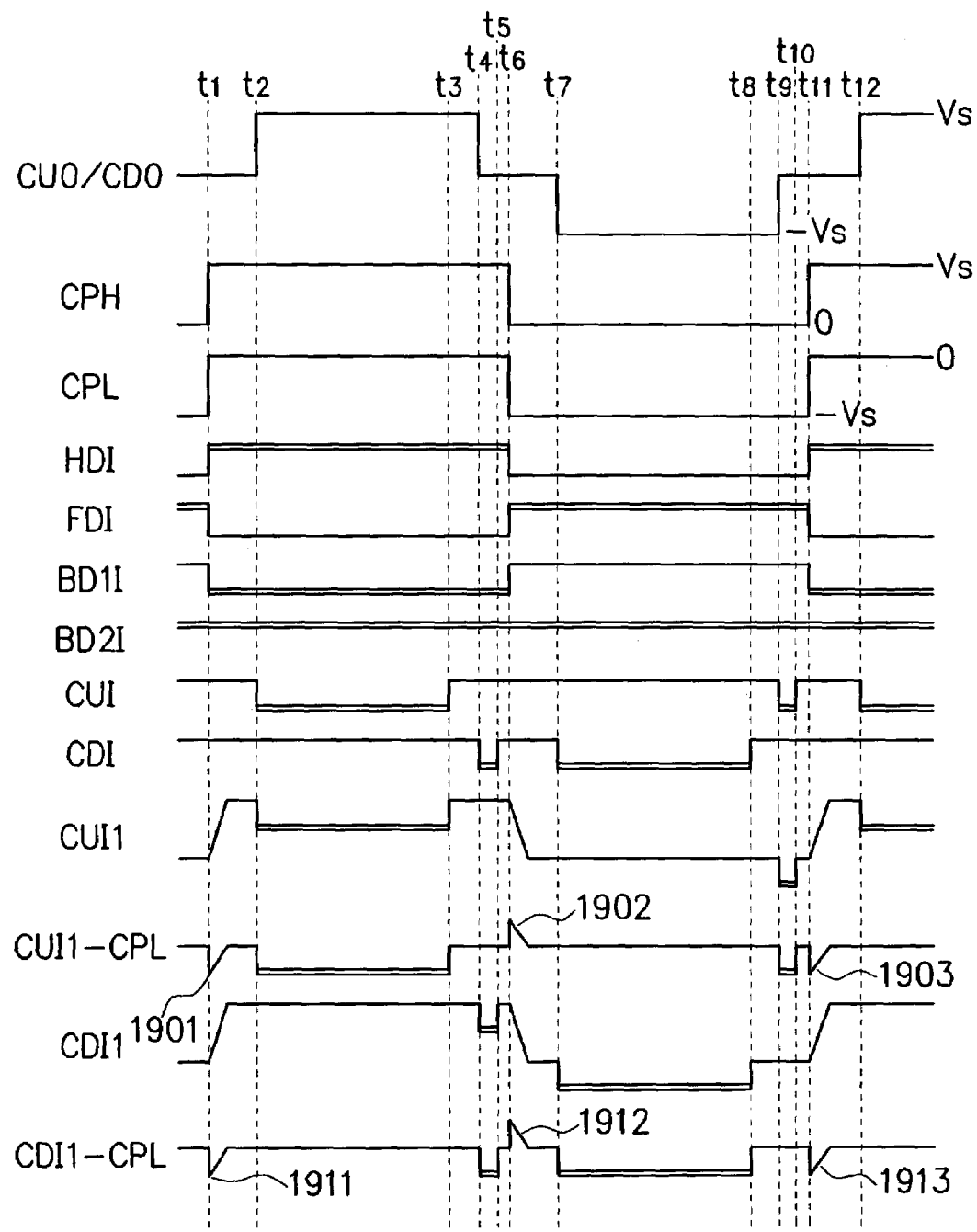
FIG. 19 is a timing chart showing the operations of the circuits in FIG. 17.

FIG. 19 is a timing chart showing the operations of the circuits in FIG. 17. The basic operations are the same as those in the timing chart shown in FIG. 3. FIG. 19 shows signals of the control signal terminals HVI, FVI, BD1I, BD2I, CUI, and CDI. It should be noted that the signal of the control signal terminal CUI is logically inverted to become the signal on the signal line Sd (FIG. 3), and the signal of the control signal terminal CDI is logically inverted to become the signal on the signal line Se (FIG. 3). The switch HV is activated when the control signal terminal HVI is at a high level, the switch FV is activated when the control signal terminal FVI is at a high level, the switch BD1 is activated when the control signal terminal BD1I is at a low level, the switch BD2 is activated when the control signal terminal BD2I is at a high level, the switch CU is activated when the control signal terminal CUI is at a low level, and the switch CD is activated when the control signal terminal CDI is at a low level.

The signal of the terminal CUI1 is created by converting in reference the signal of the terminal CUI into the signal of the terminal CPL (in other words, the signal of the terminal CUI1 is a signal creating by superimposing the signal of the terminal CUI on the signal of the terminal CPL), and thus has delays in rising and falling edges by the influence of the integration circuit constituted of the parasitic capacitance C1, the output impedance of the signal level conversion circuit 101*da*, and so on. It should be noted that the signal of the terminal CPL has very little delays in rising and falling edges because it is driven at low impedance by the switches BD1 and BD2. As a result, noises 1901 to 1903 occur in the voltage between the terminals CUI1 and CPL which is substantially inputted to the IC terminal 1711. The noises 1901 and 1903 might turn on the switch CU by accident. The noise 1902 is at a voltage outside a specified range and thus might deteriorate or break the IC 1704.

Similarly, the signal of the terminal CDI1 is created by converting in reference the signal of the terminal CDI into the signal of the terminal CPL (in other words, the signal of the terminal CDI1 is a signal creating by superimposing the signal of the terminal CDI on the signal of the terminal CPL), and thus has delays in rising and falling edges by the influence of the integration circuit constituted of the parasitic capacitance C2, the output impedance of the signal level conversion circuit 101e, and so on. As a result, noises 1911 to 1913 occur in the voltage between the terminals CDI1 and CPL which is substantially inputted to the IC terminal 1712. The noises 1911 and 1913 might turn on the switch CD by accident. The noise 1912 is at a voltage outside the specified range and thus might deteriorate or break the IC 1704.

When the above-described parasitic capacitances C1 and C2 are small, the power module according to this embodiment operates normally. In the next embodiment, a power module for eliminating the above-described noises will be explained.

Fourth Embodiment

Figure 20:
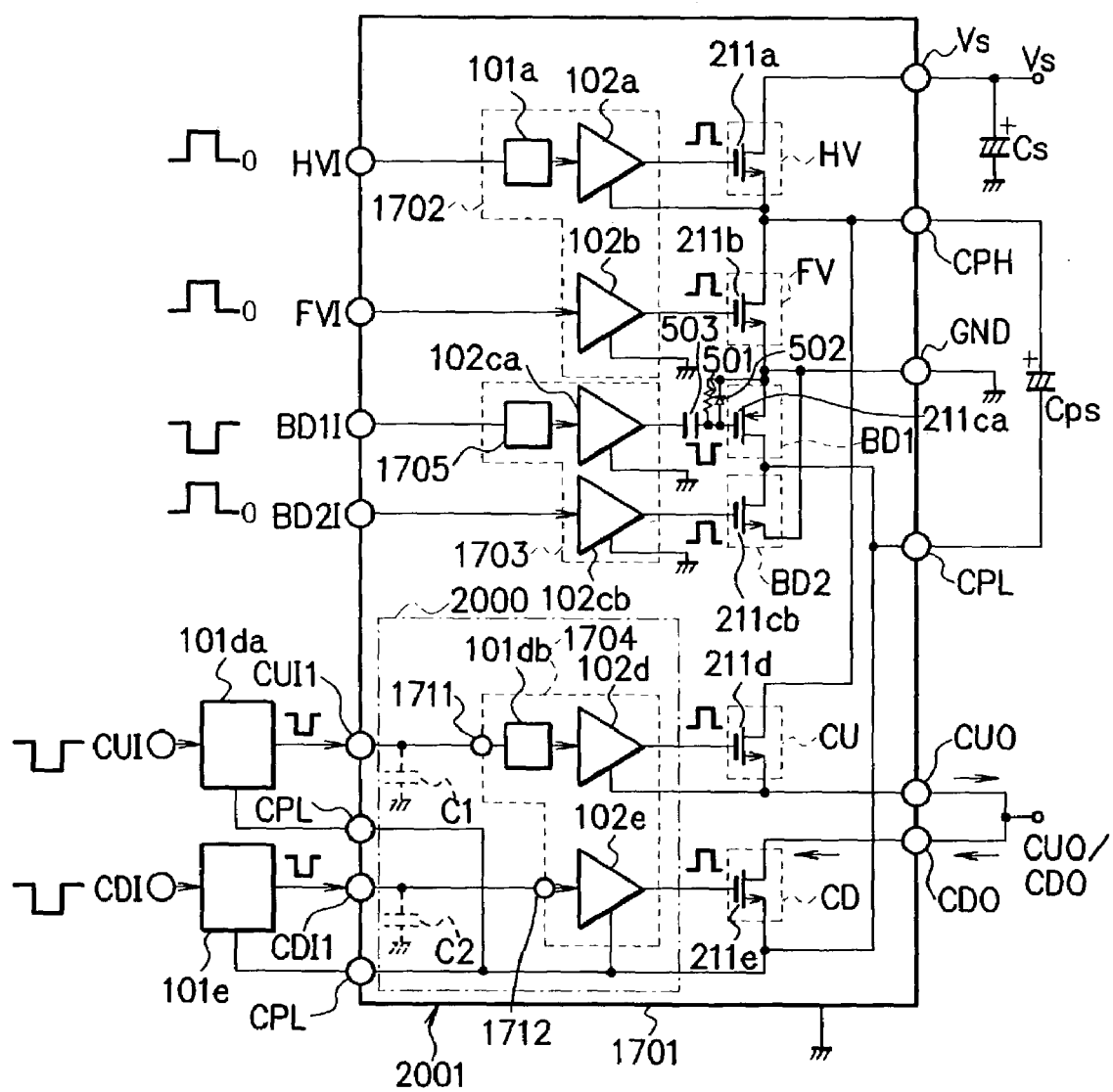
FIG. 20 is a view showing a power module according to a fourth embodiment of the present invention.

FIG. 20 shows a power module 2001 according to the fourth embodiment of the present invention. The power module 2001 is basically the same as the power module 1700 in FIG. 17, and thus only different points therebetween are explained. In this embodiment, a metal substrate 1701 has an opening 2000 where no metal substrate exists. The opening 2000 is provided at a portion including all or part of an IC 1704, a wiring between a terminal CUI1 and a terminal 1711, and a wiring between a terminal CDI1 and a terminal 1712. In other words, switches HV, FV, BD (BD1 and BD2), CU, and CD, and amplification circuits 102a, 102b, and 102c (102ca and 102cb) except all or part of amplification circuits 102d and 102e, the wiring between the terminal CUI1 and the terminal 1711, and the wiring between the terminal CDI1 and the terminal 1712, are provided on the metal substrate 1701. This can make the above-described parasitic capacitances C1 and C2 very small, thus allowing noise to be reduced as described later with reference to FIG. 29.

Figure 21A:
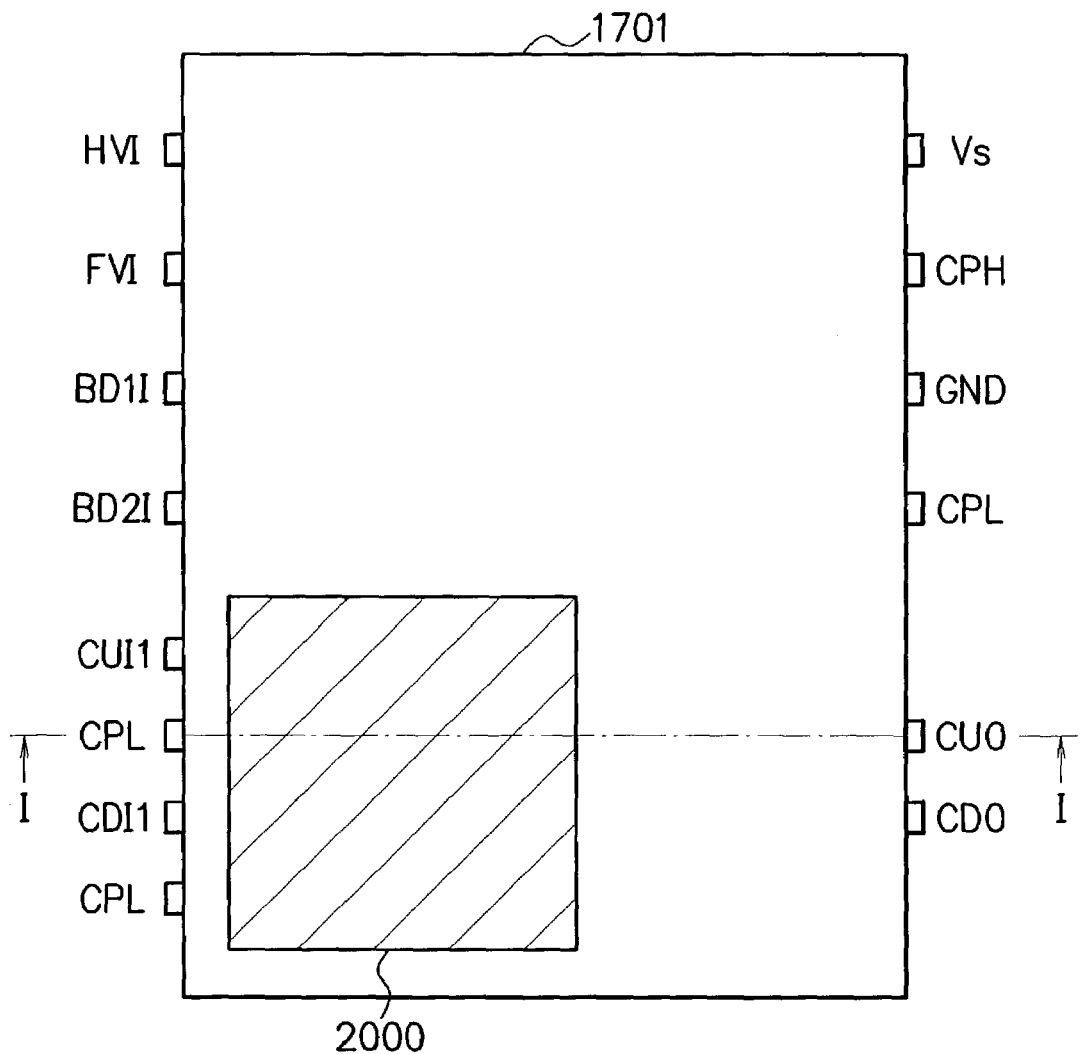
FIG. 21A is a top view of the power module in FIG. 20.
Figure 21B:
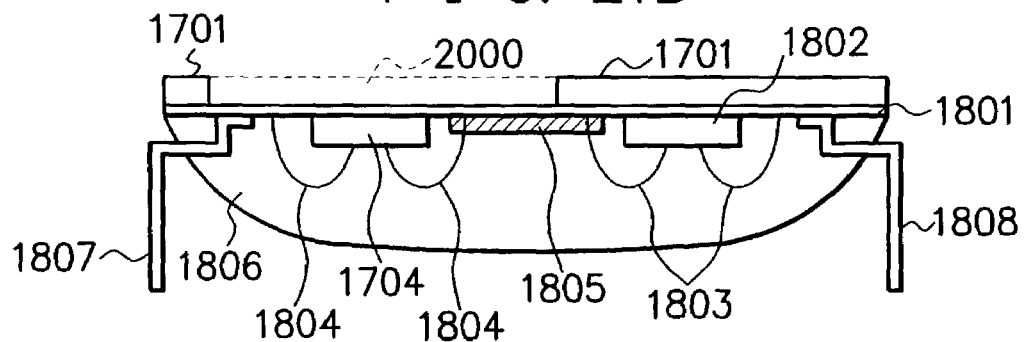
FIG. 21B is a cross-sectional view taken along a line I—I in FIG. 21A.

FIG. 21A is a top view of the power module 2001 in FIG. 20, and FIG. 21B is a cross-sectional view taken along a line I—I in FIG. 21A. FIGS. 21A and 21B are basically the same as FIGS. 18A and 18B, and thus only different points therebetween are explained. The metal substrate 1701 has the opening 2000. The opening 2000 is provided at the part including a connecting portions of the IC 1704 and an IC pin 1807.

A method of forming the opening 2000 is explained next. First, an insulator (for example, plastic) 1801 is applied on the metal substrate (for example, aluminum). On the insulator 1801, the IC chips 1704 and 1802 and so on are provided and molded with a resin 1806. Thereafter, the above-described metal substrate is etched into a predetermined pattern to form the metal substrate 1701 having the opening 2000.

Figure 29:
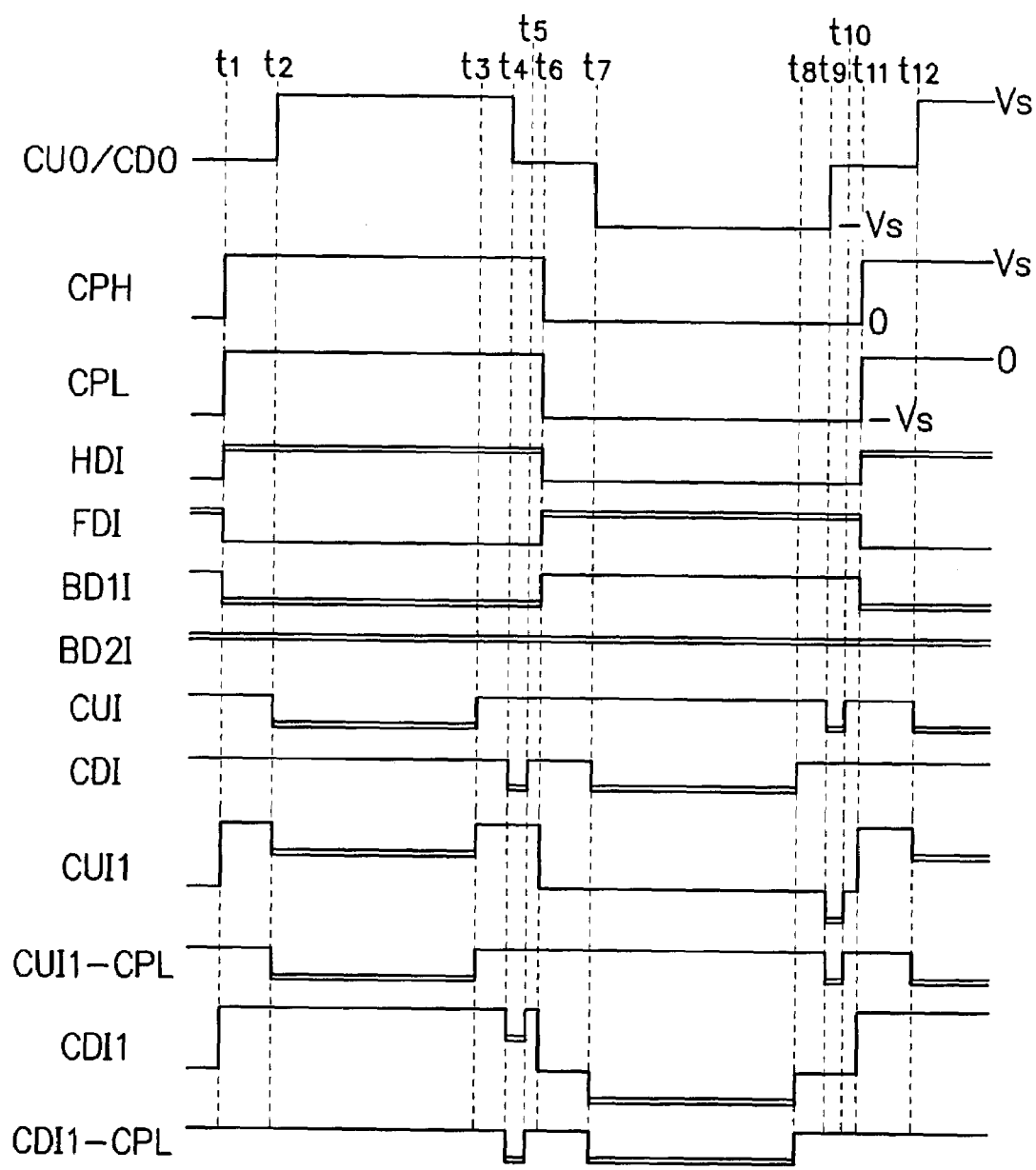
FIG. 29 is a timing chart showing the operations of the circuits in FIG. 20.

FIG. 29 is a timing chart showing the operations of the circuits of this embodiment. The basic operations are the same as those in the timing chart of the third embodiment (FIG. 19), and thus only different points therebetween are explained. The signal of the terminal CUI1 steeply rises and falls because of a small parasitic capacitance C1. As a result, no noise occurs in the voltage between the terminals CUI1 and CPL which is substantially inputted to the IC terminal 1711. Similarly, the signal of the terminal CDI1 steeply rises and falls because of a small parasitic capacitance C2. As a result, no noise occurs in the voltage between the terminals CDI1 and CPL which is substantially inputted to the IC terminal 1712. By preventing noises, the switches CU and CD can be prevented from malfunctioning to avoid the deterioration and breakage of the IC 1704.

Fifth Embodiment

Figure 22A:
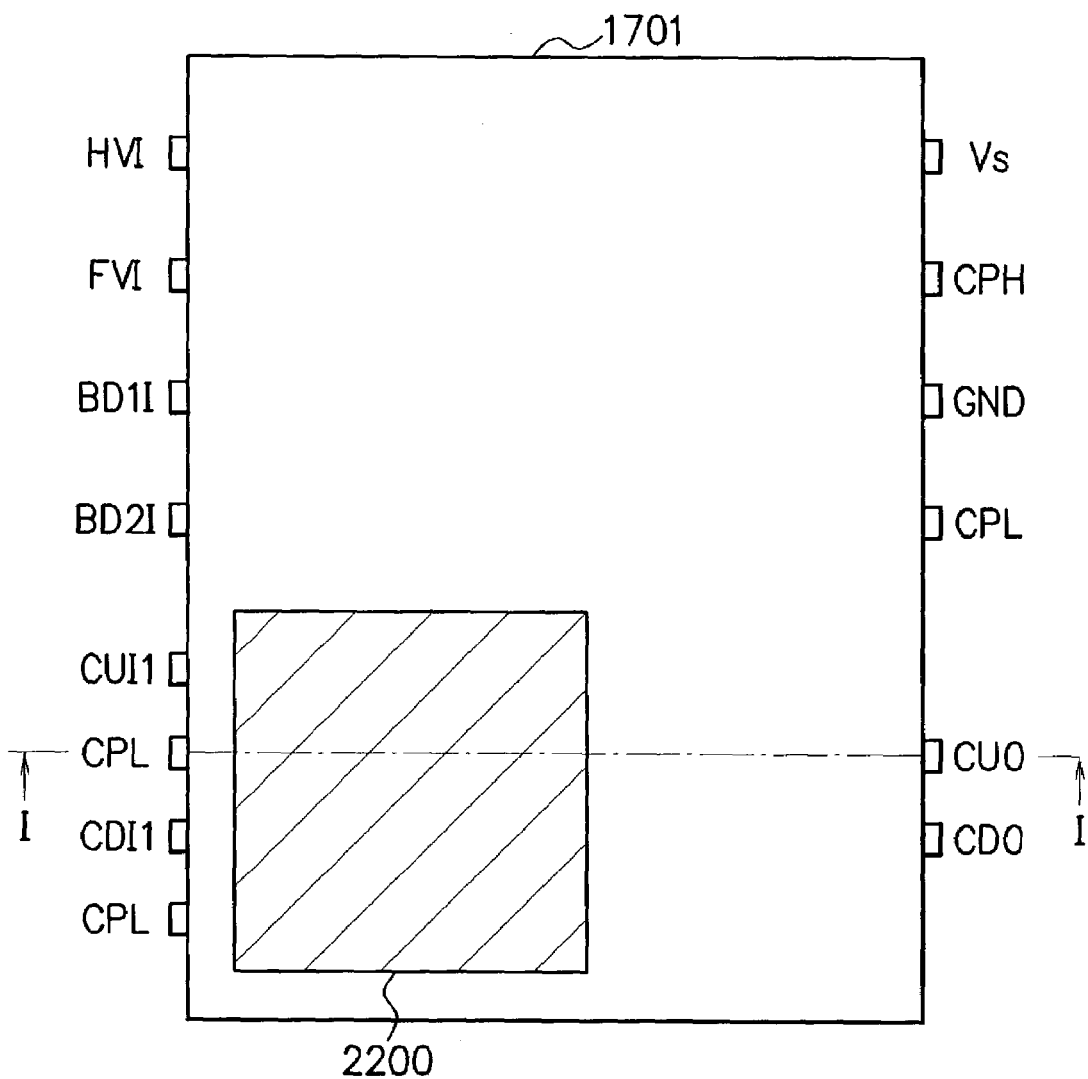
FIGS. 22A and 22B are views showing a power module of a fifth embodiment of the present invention.
Figure 22B:
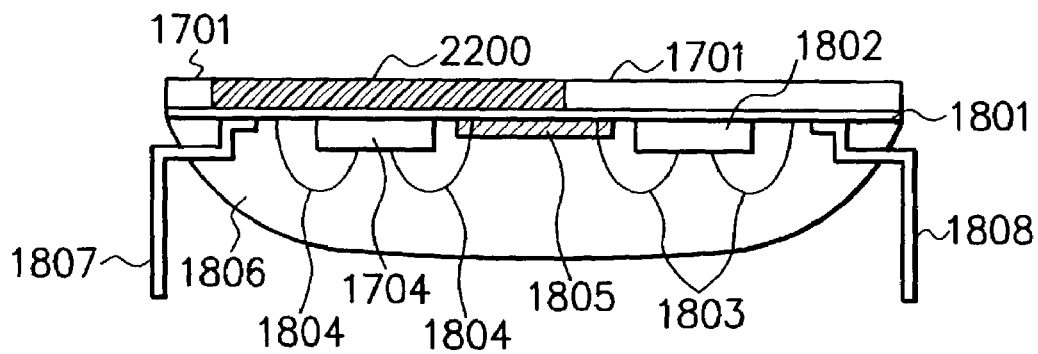

FIGS. 22A and 22B show a power module according to the fifth embodiment of the present invention. FIG. 22A is a top view of the power module 2001 (FIG. 20), and FIG. 22B is a cross-sectional view taken along a line I—I in FIG. 22A. FIGS. 22A and 22B are basically the same as FIGS. 21A and 21B, and thus only different points therebetween are explained. In FIGS. 21A and 21B, the power module 2001 has a cavity at the opening 2000 and might be mechanically weak. Hence, in this embodiment, a plastic substrate (or ceramic substrate) 2200 is provided in the opening 2000. This can make the parasitic capacitances C1 and C2 small and provide an increased mechanical strength.

Sixth Embodiment

FIG. 23 shows a power module 2300, external circuits 101da, 101e, 101fa, 101g, and so on according to the sixth embodiment of the present invention. The power module 2300 is made by adding a power recovery circuit to the power module 1700 in FIG. 17. The power module 2300 is provided on a metal substrate 1701 having an opening 2000, and further has external terminals LUI1, CPL, LDI1, and CPL, and external terminals 2311, 2312, 2313, and 2314. Hereafter, the power recovery circuit is explained.

A series circuit of capacitors Cp1 and Cp2 is connected between terminals CPH and CPL. An interconnection point 2331 between the capacitors Cp1 and Cp2 is connected to the terminals 2311 and 2314. A diode 2321 has an anode connected to a terminal CUO and a cathode connected to a terminal CUO/CDO. A diode 2322 has an anode connected to the CUO/CDO and a cathode connected to a terminal CDO. The terminal CUO/CDO is connected to the X electrode or the Y electrode in FIG. 8. A diode 2323 has an anode connected to the terminal 2312 and a cathode connected to the terminal CUO through a coil L1. A diode 2324 has an anode connected to the terminal CDO through a coil L2 and a cathode connected to the terminal 2313.

The signal level conversion circuit 101fa has an input terminal connected to a control signal terminal LUI, a power-supply terminal connected to the terminal CPL, and an output terminal connected to the terminal LUI1. The signal level conversion circuit 101fa converts, similarly to the signal level conversion circuit 101da, the signal using the ground as a reference of the terminal LUI into a signal using the voltage at the terminal CPL as a reference, and outputs it to the terminal LUI1. The terminal LUI1 is wired and connected to a terminal 2305 of an IC 2304. A wiring between the terminal LUI1 and the terminal 2305 is provided within the opening 2000 of the metal substrate 1701, so that a parasitic capacitance C3 is made small. The IC 2304 has, similarly to the IC 1704, one signal level conversion circuit 101fb and two amplification circuits 102f and 102g. The signal level conversion circuit 101fb has an input terminal connected to the terminal 2305 and an output terminal connected to an input terminal of the amplification circuit 102f, and converts, similarly to the signal level conversion circuit 101*db,* a signal into a signal using the voltage at the terminal CUO as a reference. A switch LU has an n-channel power MOSFET 211*f*. The FET 211*f* has a gate connected to an output terminal of the amplification circuit 102*f,* a source connected to the terminal 2312, and a drain connected to the terminal 2311.

The signal level conversion circuit 101*g* has an input terminal connected to a control signal terminal LDI, a power-supply terminal connected to the terminal CPL, and an output terminal connected to the terminal CDI1. The signal level conversion circuit 101*g* converts, similarly to the signal level conversion circuit 101*e,* the signal using the ground as a reference of the terminal LDI into a signal using the voltage at the terminal CPL as a reference, and outputs it to the terminal LDI1. The terminal LDI1 is wired and connected to a terminal 2306 of the IC 2304. A wiring between the terminal LDI1 and the terminal 2306 is provided within the opening 2000 of the metal substrate 1701, so that a parasitic capacitance C4 is made small. The amplification circuit 102*g* has an input terminal connected to the terminal 2306 and an output terminal connected to a gate of an n-channel power MOSFET 211*g* through a capacitor 2301. The FET 211*g* constitutes a switch LD and has a source connected to the terminal 2314 and a drain connected to the terminal 2313. A resistor 2302 is connected between the gate and source of the FET 211*g*. A diode 2303 has an anode connected to the source of the FET 211*g* and a cathode connected to the gate of the FET 211*g*.

By providing the opening 2000 and making the parasitic capacitances C1 to C4 small, noise can be reduced. Other structures on the analogy of the above-described embodiments are adoptable as long as the structures make the parasitic capacitances C1 to C4 small. It should be noted that the terminals LUI and LDI are supplied with a control signal from the drive control circuit 801 (FIG. 8). Besides, the IC 2304 is configured so that the signal of the terminal 2305 and the gate signal of the FET 211*f* are logically inverted, and the signal of the terminal 2306 and the gate signal of the FET 211*g* are logically inverted.

Figure 24:
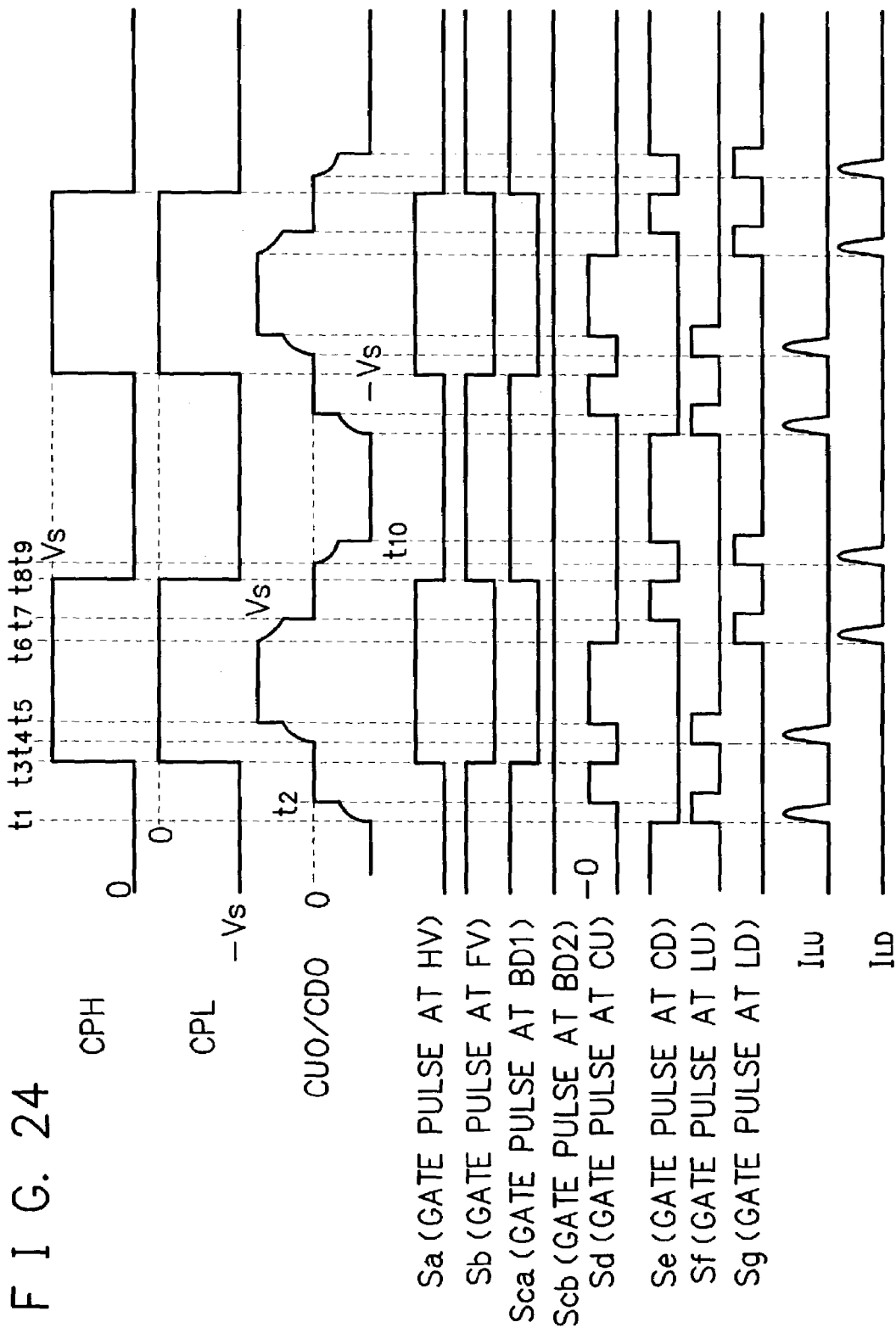
FIG. 24 is a waveform chart showing the operations of the circuits shown in FIG. 23.

FIG. 24 is a waveform chart showing the operations of the circuits shown in FIG. 23. In this chart, control signal lines Sa, Sb, Sca, Scb, Sd, Se, Sf and Sg are control signal lines (gate lines) of switches HV, FV, BD1, BD2, CU, CD, LU and LD in FIG. 23 respectively.

In this operations, the switch BD2 is always in an ON state. The switch BD1 is a p-channel power MOSFET 211*ca* and thus turns into a conducting state at a low level. The other switches are n-channel power MOSFETs and thus turn into a conducting state at a high level. Hereafter, positive power-supply voltage is indicated as Vs[V] and negative power-supply voltage as −Vs[V].

(1) At time t1, the switch LU turns on. In this event, the switches HV, BD1, CU, LD and CD are in an OFF state, and the switches FV and BD2 are in an ON state. As a result, the terminal CPH is at the ground (0V), and the terminal CPL is at −Vs. The potential at the connection point 2331, which is an intermediate potential between those at the terminals CPH and CPL, is −Vs/2. When the switch LU turns on, a current ILU flows, so that the output voltage terminal CUO/CDO increases in voltage from −Vs to near −Vs/2 due to LC resonance. The use of discharge of the capacitors Cp1 and Cp2 enables a reduction in power consumption.

(2) At time t2, the switch CU turns on. As a result, the output voltage terminal CUO/CDO is connected to the terminal CPH to increase in voltage to the ground. Thereafter, the switch LU turns off.

(3) At time t3, the switches FV and CU turn off, and thereafter the switches HV and BD1 turn on. As a result, the terminal CPH is at Vs, and the terminal CPL is at the ground. The capacitor CPS is charged to be at Vs. The potential at the connection point 2331, which is the intermediate potential between those at the terminals CPH and CPL, is Vs/2.

(4) At time t4, the switch LU turns on to allow the current ILU to flow. The output voltage terminal CUO/CDO increases in voltage to near Vs/2 due to LC resonance. The use of discharge of the capacitors Cp1 and Cp2 enables a reduction in power consumption.

(5) At time t5, the switch CU turns on. The output voltage terminal CUO/CDO is at Vs similarly to the terminal CPH. Thereafter, the switch LU turns off.

(6) At time t6, the switch CU turns off, and the switch LD turns on to allow a current ILD to flow. The electric charge of capacitive load between the X electrode and the Y electrode is discharged to the connection point 2331 (capacitors Cp1 and Cp2) through the terminal CUO/CDO due to LC resonance. The output voltage terminal CUO/CDO falls in voltage to near Vs/2. The use of charge of the capacitors Cp1 and Cp2 enables a reduction in power consumption.

(7) At time t7, the switch CD turns on. In this event, a sink current flows from the output terminal CDO through the switches CD and BD2, so that the output voltage terminal CUO/CDO is clamped at the ground. Thereafter, the switch LD turns off.

(8) At time t8, the switches HV and BD1 turn off, and then the switch FV turns on. As a result, the terminal CPH is at the ground, and the voltage terminal CPL at the other end of the capacitor CPS is at −Vs. In this event, the switch CD is turned off for the output voltage terminal CUO/CDO to be kept at the ground. The connection point 2331 becomes −Vs/2 being the intermediate potential between those at the terminals CPH and CPL.

(9) At time t9, the switch LD turns on to allow the current ILD to flow. The electric charge of the capacitive load between the X electrode and the Y electrode is discharged to the connection point 2331 (capacitors Cp1 and Cp2) through the terminal CUO/CDO due to LC resonance. The output voltage terminal CUO/CDO falls in voltage to near −Vs/2. The use of charge of the capacitors Cp1 and Cp2 enables a reduction in power consumption.

(1) At time t10, the switch CD is turned on. As a result, the output voltage terminal CUO/CDO is clamped at −Vs. Thereafter, the switch LD turns off.

The above is one cycle of processing, and hereafter the same processing is repeated. As described above, the addition of the aforesaid power recovery circuit enables a reduction in power consumption.

Seventh Embodiment

Figure 25:
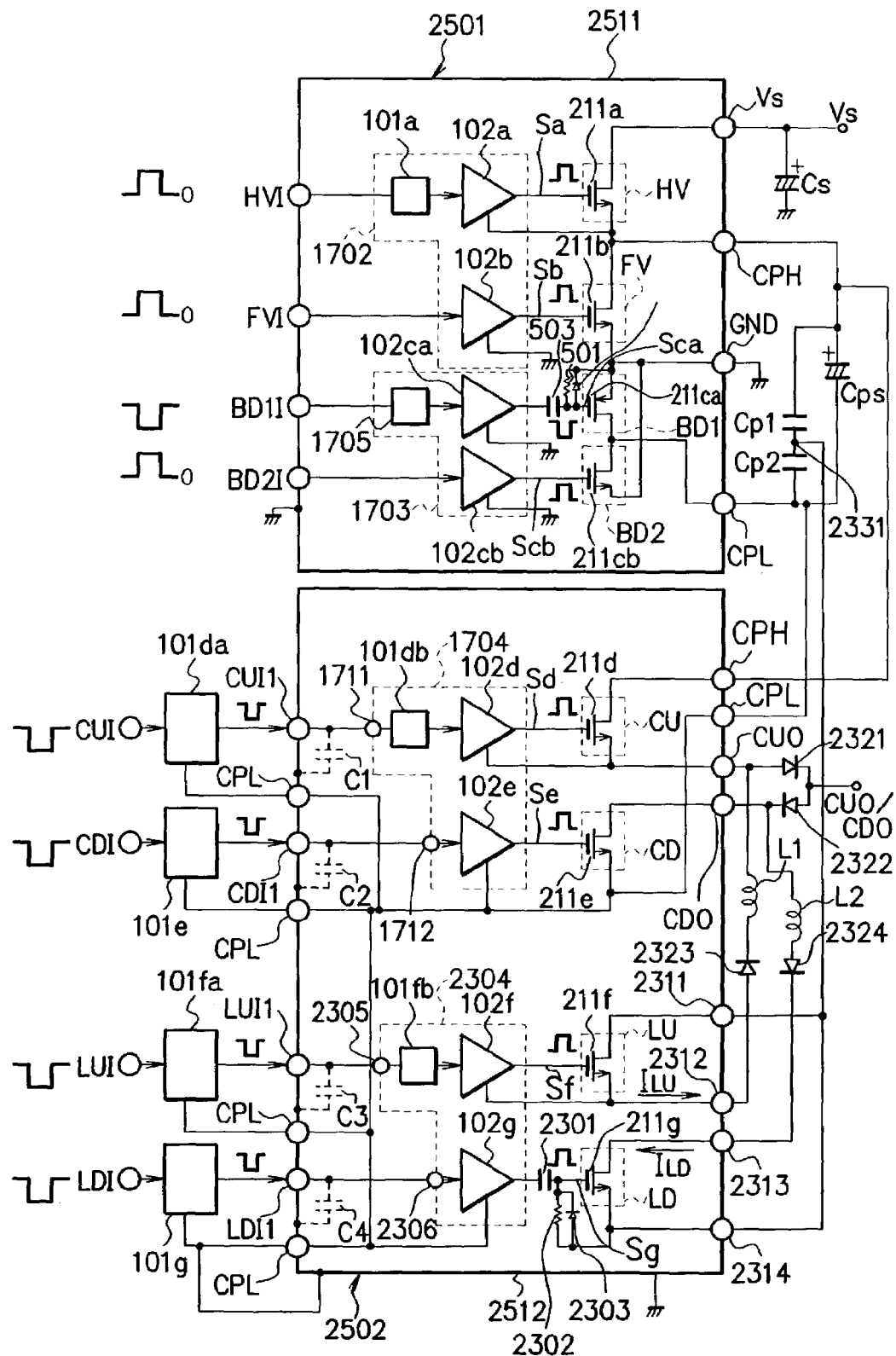
FIG. 25 is a power module and external circuits according to a seventh embodiment of the present invention.

FIG. 25 shows power modules 2501 and 2502, external circuits 101*da,* 101e, 101*fa,* 101*g,* and so on according to the seventh embodiment of the present invention. The first power module 2501 and the second power module 2502 are made by dividing the power module 2300 in FIG. 23 into two. The first power module 2501 has ICs 1702 and 1703 and switches HV, FV, BD1 and BD2 and is provided on a metal substrate 2511 connected to a ground terminal GND. The second power module 2502 has ICs 1704 and 2304 and switches CU, CD, LU and LD and is provided on a metal substrate 2512 connected to terminals CPL. The metal substrate 2512 has no opening. On the metal substrate 2512, a wiring between a terminal CUI1 and a terminal 1711, a wiring between a terminal CDI1 and a terminal 1712, a wiring between a terminal LUI1 and a terminal 2305, and a wiring between a terminal LDI1 and a terminal 2306 are also provided. Parasitic capacitances C1 to C4 of these wirings are formed on the metal substrate 2512 connected to the terminals CPL, so that noise can be reduced. Specifically, it is possible to make voltages at the terminals CUI1, CDI1, LUI1 and LDI1 steeply rise and fall. This results in reductions in noise in the voltage between the terminal CUI1 and the terminal CPL, the voltage between the terminal CDI1 and the terminal CPL, the voltage between the terminal LUI1 and the terminal CPL, and the voltage between the terminal LDI1 and the terminal CPL.

Eighth embodiment

Figure 26:
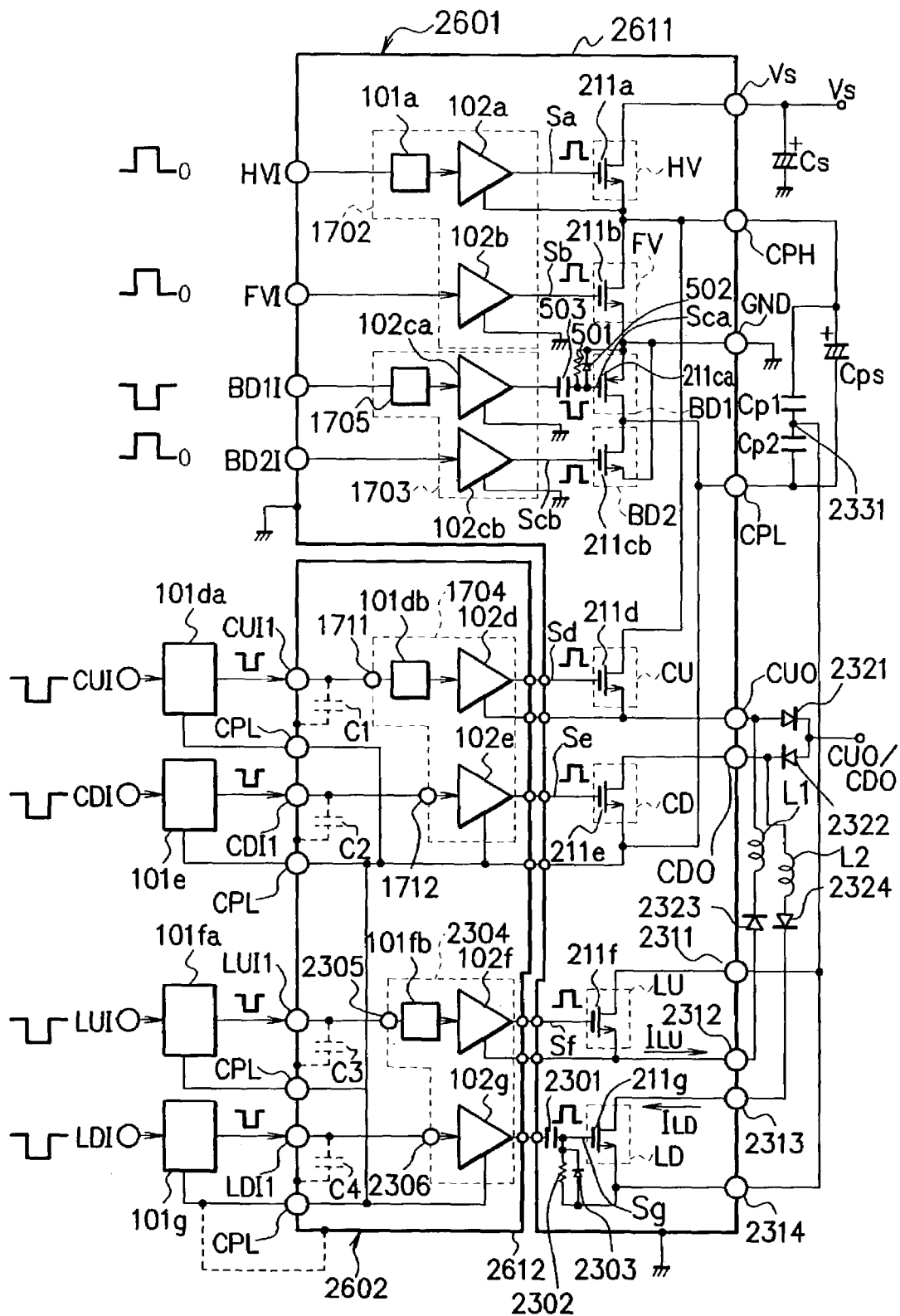
FIG. 26 is a view showing a power module and external circuits according to an eighth embodiment of the present invention.

FIG. 26 shows power modules 2601 and 2602, external circuits 101da, 101e, 101fa, 101g, and so on according to the eighth embodiment of the present invention. The first power module 2601 and the second power module 2602 are made by dividing the power module 2300 in FIG. 23 into two. The first power module 2601 has ICs 1702 and 1703 and switches HV, FV, BD1, BD2, CU, CD, LU and LD and is provided on a metal substrate 2611 connected to a ground terminal GND. The second power module 2602 has ICs 1704 and 2304 and is provided on a substrate 2612. The substrate 2612 is an entirely metal substrate connected to terminals CPL similarly to that of the seventh embodiment (FIG. 25). Besides, the substrate 2612 may be an insulating substrate such as a plastic substrate, a ceramic substrate, or the like. This can make parasitic capacitances C1 to C4 small to reduce noise.

As in the above-described third to eighth embodiments, the switch HV and so on are constituted of the IC 1802 (FIG. 18B), and the signal level conversion circuits and the amplification circuits are constituted of the IC 1704 and so on to form one power module, thereby enabling a reduction in size and the number of parts thereof as compared to the case where the respective circuits are constituted of discrete components.

Ninth Embodiment

Figure 27:
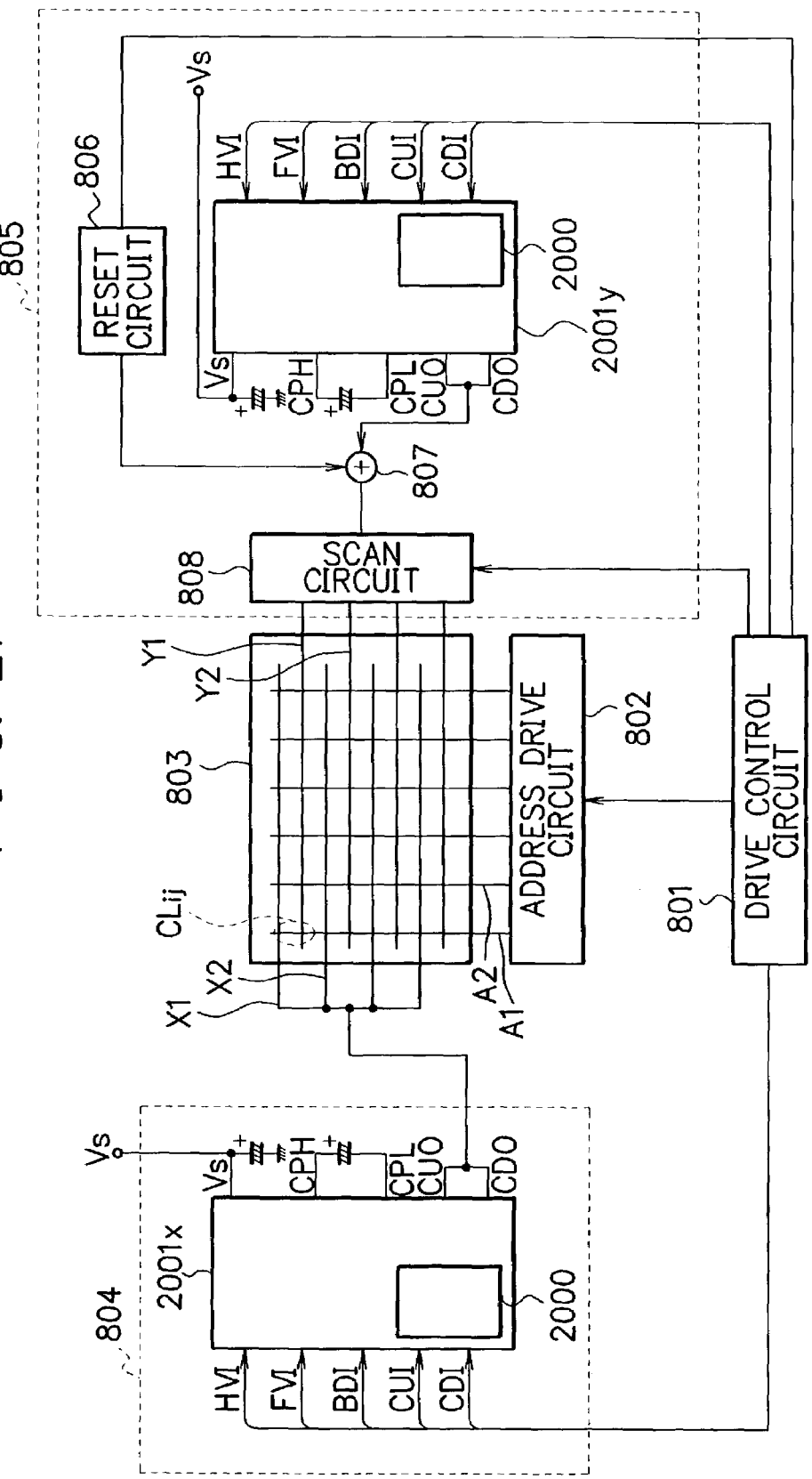
FIG. 27 is a view showing a plasma display device of a progressive system according to a ninth embodiment of the present invention.

FIG. 27 shows a plasma display device of the progressive system according to the ninth embodiment of the present invention. In this plasma display device, two pieces of the power module 2001, which is shown in FIG. 20, are used as power modules 2001x and 2001y. The power modules 2001x and 2001y are provided on metal substrates having openings 2000 respectively. The other points of this plasma display device are the same as those in FIG. 8. The power modules shown in the other embodiments can also be used similarly in a plasma display device of the progressive system.

Tenth Embodiment

Figure 28:
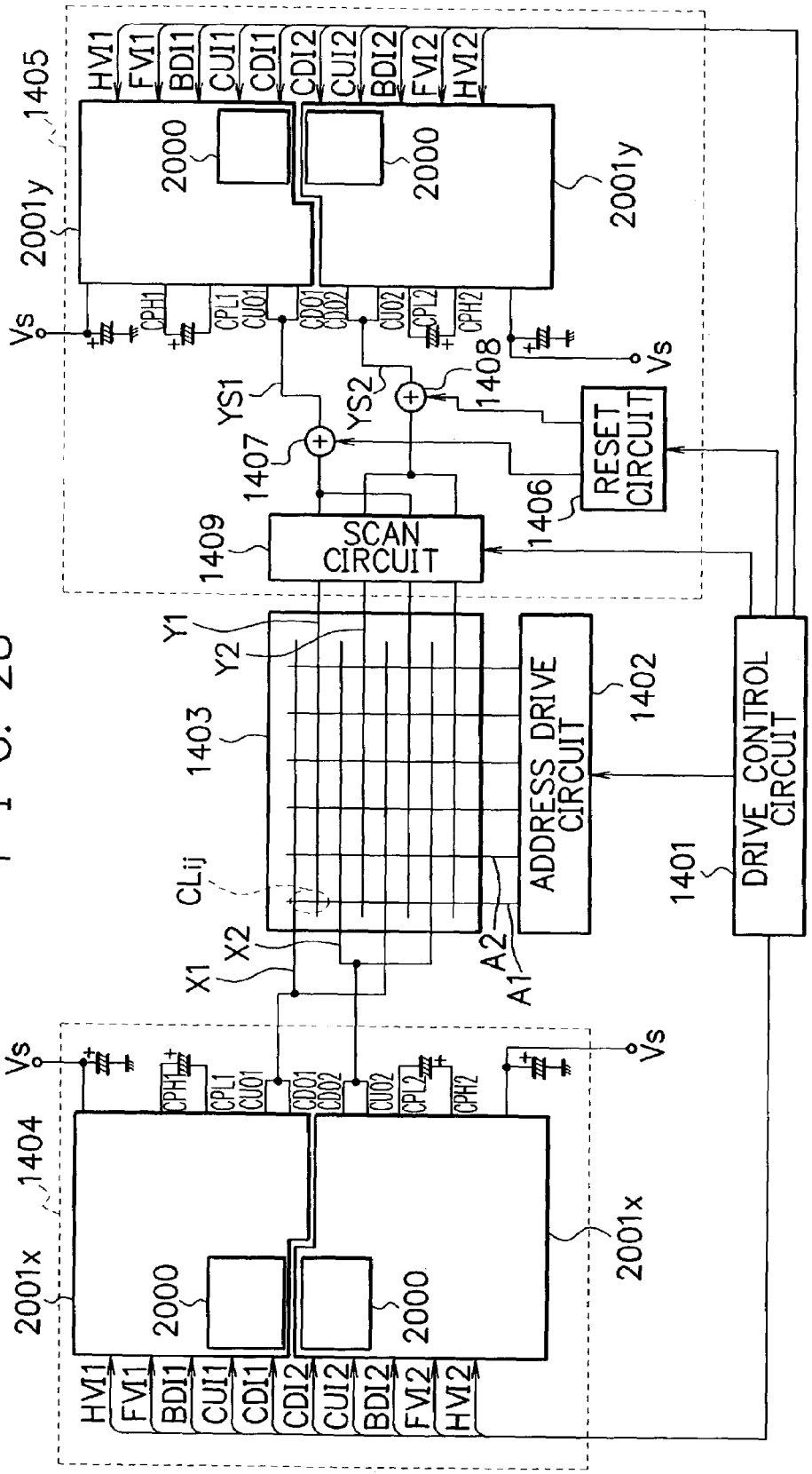
FIG. 28 is a view showing a plasma display device of the ALIS system according to a tenth embodiment of the present invention.

FIG. 28 shows a plasma display device of the ALIS system according to the tenth embodiment. In this plasma display device, pieces of the power module 2001, which is shown in FIG. 20, are used as two power modules 2001x and two power modules 2001y. The power modules 2001x and 2001y are provided on metal substrates having openings 2000 respectively. In this plasma display device, the other points are the same as those in FIG. 14. The power modules shown in the other embodiments can also be used similarly in a plasma display device of the ALIS system. The power module of the above-described embodiment is applicable to other display devices in addition to the plasma display device.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As has been described, the modularization of the first to the third switch and the first to the third amplification circuit in the same power module makes it possible to decrease changes in the operation timings of the first to the third switch due to their surrounding temperatures so as to keep margins of their operation timings appropriate. The use of this power module in a display device enables further improvement in reliability of the display device.

Since all or part of the amplification circuits and the input wirings are not provided on the metal substrate, the parasitic capacitances thereof can be reduced to prevent a malfunction of the power module. Further, the power module is constituted using the metal substrate, thereby enabling a reduction in size of circuits and the number of parts thereof as compared to the case where the respective circuits are constituted of discrete components.

What is claimed is:

1. A power module, comprising:
    a power-supply voltage terminal for inputting a power-supply voltage;
    a ground terminal;
    a first voltage terminal;
    a second voltage terminal;
    a first switch connected between said power-supply voltage terminal and said first voltage terminal;
    a second switch connected between said first voltage terminal and said ground terminal;
    a third switch connected between said second voltage terminal and said ground terminal; and
    first to third amplification circuits, modularized with the first to the third switches in the power module, which amplify control signals controlling said first to said third switches, respectively.

2. The power module according to claim 1, further comprising:
    a third voltage terminal;
    a fourth voltage terminal;
    a fourth switch connected between said first voltage terminal and said third voltage terminal;
    a fifth switch connected between said second voltage terminal and said fourth voltage terminal; and
    fourth and fifth amplification circuits which amplify control signals controlling said fourth and said fifth switches, respectively.

3. The power module according to claim 1, wherein said first to said third amplification circuits are arranged on a metal substrate or a ceramic substrate.

4. The power module according to claim 1, wherein said first to said third switches and said first to said third amplification circuits are arranged on one metal substrate or ceramic substrate.

5. The power module according to claim 2, wherein said first to said fifth switches and said first to said fifth amplification circuits are arranged on a metal substrate or a ceramic substrate.

6. The power module according to claim 2, wherein said first to said fifth switches and said first to said fifth amplification circuits are arranged on a metal substrate.

7. The power module according to claim 2, further comprising:

a capacitor connected between said first voltage terminal and said second voltage terminal.

8. The power module according to claim 2, further comprising:
signal level conversion circuits converting levels of the control signals for said first switch, said fourth switch, and said fifth switch.

9. The power module according to claim 2, wherein said first to said fifth switches are constituted using power MOSFETs or IGBTs, and said first to said fifth amplification circuits supply the control signals to gates of the power MOSFETs or IGBTs.

10. The power module according to claim 2, wherein said first voltage terminal is at a pulse voltage having levels of a positive power-supply voltage and ground, and said second voltage terminal is at a pulse voltage having levels of ground and a negative power-supply voltage.

11. The power module according to claim 10, wherein said third switch is constituted using a p-channel power MOSFET or IGBT clamping said switch at ground when said second voltage terminal is at a negative voltage, and an n-channel power MOSFET or IGBT clamping said switch at ground when said second voltage terminal is at a positive voltage.

12. The power module according to claim 2, further comprising:
an amplification circuit power-supply voltage terminal inputting an amplification circuit power-supply voltage for driving said first to said fifth amplification circuit;
a first amplification circuit switch connected between said amplification circuit power-supply voltage terminal and a power-supply voltage terminal of said first amplification circuit;
a second amplification circuit switch connected between a power-supply voltage terminal of said fourth amplification circuit and a power-supply voltage terminal of said fifth amplification circuit; and
a third amplification circuit switch connected between said amplification circuit power-supply voltage terminal and the power-supply voltage terminal of said fifth amplification circuit.

13. The power module according to claim 10, wherein said third switch is constituted using a first n-channel power MOSFET or IGBT clamping said switch at ground when said second voltage terminal is at a negative voltage, and a second n-channel power MOSFET or IGBT clamping said switch at ground when said second voltage terminal is at a positive voltage, and said third amplification circuit includes two amplification circuits supplying the control signals to said first and said second n-channel power MOSFET or IGBT, respectively.

14. The power module according to claim 13, further comprising:
an amplification circuit power-supply voltage terminal inputting an amplification circuit power-supply voltage for driving said first to said fifth amplification circuit;
a first amplification circuit switch connected between said amplification circuit power-supply voltage terminal and a power-supply voltage terminal of said first amplification circuit;
a second amplification circuit switch connected between a power-supply voltage terminal of said fourth amplification circuit and a power-supply voltage terminal of said fifth amplification circuit;
a third amplification circuit switch connected between said amplification circuit power-supply voltage terminal and the power-supply voltage terminal of said fifth amplification circuit; and
a fourth amplification circuit switch connected between said amplification circuit power-supply voltage terminal and a power-supply voltage terminal of the amplification circuit supplying the control signal to said first n-channel power MOSFET or IGBT.

15. The power module according to claim 2, further comprising:
input-output delay time adjustment circuits adjusting delay times of the control signals for said fourth and said fifth switch.

16. The power module according to claim 2, further comprising:
input-output delay time adjustment circuits adjusting delay times of the control signals for said first to said fifth switches.

17. A display device, comprising:
a power module; and
a display panel connected to said power module, wherein said power module comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
a first to a third amplification circuits, modularized with the first to the third switches in the power module, which amplify control signals controlling said first to said third switches, respectively;
a third voltage terminal connected to said display panel;
a fourth voltage terminal connected to said display panel;
a fourth switch connected between said first voltage terminal and said third voltage terminal;
a fifth switch connected between said second voltage terminal and said fourth voltage terminal; and
a fourth and a fifth amplification circuits, modularized with the fourth and the fifth switches in the power module, which amplify control signals controlling said fourth and said fifth switches, respectively.

18. The display device according to claim 17, wherein said display panel is a plasma display panel.

19. A power module comprising a first switching circuit and a second switching circuit, modularized in the power module, wherein
each of said first switching circuit and said second switching circuit, comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal; and first to third amplification circuits which amplify control signals controlling said first to said third switches, respectively.

20. The power module according to claim 19, wherein each of said first switching circuit and said second switching circuit, further comprises:
a third voltage terminal;
a fourth voltage terminal;
a fourth switch connected between said first voltage terminal and said third voltage terminal;
a fifth switch connected between said second voltage terminal and said fourth voltage terminal; and
fourth and fifth amplification circuits which amplify control signals controlling said fourth and said fifth switches, respectively.

21. The power module according to claim 20, wherein said first switching circuit and said second switching circuit are arranged on a metal substrate or a ceramic substrate.

22. The power module according to claim 20, wherein said first switching circuit and said second switching circuit are arranged on a metal substrate.

23. A display device, comprising:
a power module; and
a display panel connected to said power module, wherein said power module comprises a first switching circuit and a second switching circuit, modularized on the power module, and
each of said first switching circuit and said second switching circuit, comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
first to third amplification circuits which amplify control signals controlling said first to said third switches, respectively;
a third voltage terminal connected to said display panel;
a fourth voltage terminal connected to said display panel;
a fourth switch connected between said first voltage terminal and said third voltage terminal;
a fifth switch connected between said second voltage terminal and said fourth voltage terminal; and
fourth and fifth amplification circuits which amplify control signals controlling said fourth and said fifth switches, respectively.

24. The display device according to claim 23, wherein said display panel is a plasma display panel.

25. A power module, comprising:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
first to third amplification circuits, modularized with the first to the third switches in the power module, which amplify control signals controlling said first to said third switches, respectively;
a third voltage terminal;
a fourth voltage terminal;
a fourth switch connected between said first voltage terminal and said third voltage terminal;
a fifth switch connected between said second voltage terminal and said fourth voltage terminal; and
fourth and fifth amplification circuits, modularized with the fourth and the fifth switches in the power module, which amplify control signals controlling said fourth and said fifth switches, respectively;
first and second input wirings connected to inputs of said fourth and said fifth amplification circuit; and
a metal substrate,
said first to said fifth switch and said first to said third amplification circuits, except all or part of said fourth and said fifth amplification circuits and said first and said second input wirings, being provided on said metal substrate.

26. The power module according to claim 25, wherein all or part of said fourth and said fifth amplification circuits and said first and said second input wirings are provided on a plastic substrate or a ceramic substrate.

27. A display device, comprising:
a power module; and
a display panel connected to said power module,
wherein said power module comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
first to third amplification circuits, modularized with the first to the third switches in the power module, which amplify control signals controlling said first to said third switches, respectively;
a third voltage terminal connected to said display panel;
a fourth voltage terminal connected to said display panel;
a fourth switch connected between said first voltage terminal and said third voltage terminal;
a fifth switch connected between said second voltage terminal and said fourth voltage terminal;
fourth and fifth amplification circuits, modularized with the fourth and the fifth switches in the power module, which amplify control signals controlling said fourth and said fifth switches, respectively;
first and second input wirings connected to inputs of said fourth and fifth amplification circuit; and
a metal substrate,
said first to said third switch and said first to said third amplification circuits, except all or part of said fourth and said fifth amplification circuits and said first and said second input wirings, being provided on said metal substrate.

28. The display device according to claim 27, wherein said display panel is a plasma display panel.

29. A power module comprising a first power module section and a second power module section, modularized in the power module, wherein said first power module section comprises:
- a power-supply voltage terminal for inputting a power-supply voltage;
- a ground terminal;
- a first voltage terminal;
- a second voltage terminal;
- a first switch connected between said power-supply voltage terminal and said first voltage terminal;
- a second switch connected between said first voltage terminal and said ground terminal;
- a third switch connected between said second voltage terminal and said ground terminal;
- first to third amplification circuits which amplify control signals controlling said first to said third switches, respectively; and
- a first metal substrate, and wherein said second power module section comprises:
- a third voltage terminal;
- a fourth voltage terminal;
- a fourth switch connected between said first voltage terminal and said third voltage terminal;
- a fifth switch connected between said second voltage terminal and said fourth voltage terminal;
- fourth and fifth amplification circuits which amplify control signals controlling said fourth and said fifth switches, respectively; and
- a second metal substrate,
- said first to said third switch and said first to said third amplification circuits being provided on said first metal substrate, and said fourth and said fifth switches and said fourth and said fifth amplification circuits being provided on said second metal substrate.

30. The power module according to claim 29, wherein said first metal substrate is connected to said ground terminal, and said second metal substrate is connected to said second voltage terminal.

31. A display device, comprising:
- a power module; and
- a display panel connected to said power module, said power module comprising:
  - a first power module section and a second power module section, modularized in the power module, wherein said first power module section comprises:
  - a power-supply voltage terminal for inputting a power-supply voltage;
  - a ground terminal;
  - a first voltage terminal;
  - a second voltage terminal;
  - a first switch connected between said power-supply voltage terminal and said first voltage terminal;
  - a second switch connected between said first voltage terminal and said ground terminal;
  - a third switch connected between said second voltage terminal and said ground terminal;
  - first to third amplification circuits which amplify control signals controlling said first to said third switches, respectively; and
  - a first metal substrate, and wherein said second power module section comprises:
  - a third voltage terminal connected to said display panel;
  - a fourth voltage terminal connected to said display panel;
  - a fourth switch connected between said first voltage terminal and said third voltage terminal;
  - a fifth switch connected between said second voltage terminal and said fourth voltage terminal;
  - fourth and fifth amplification circuits which amplify control signals controlling said fourth and said fifth switches, respectively; and
  - a second metal substrate,
  - said first to said third switch and said first to said third amplification circuits being provided on said first metal substrate, and said fourth and said fifth switches and said fourth and said fifth amplification circuits being provided on said second metal substrate.

32. The display device according to claim 31, wherein said display panel is a plasma display panel.

33. A power module comprising a first power module section and a second power module section, modularized on the power module, wherein said first power module section comprises:
- a power-supply voltage terminal for inputting a power-supply voltage;
- a ground terminal;
- a first voltage terminal;
- a second voltage terminal;
- a first switch connected between said power-supply voltage terminal and said first voltage terminal;
- a second switch connected between said first voltage terminal and said ground terminal;
- a third switch connected between said second voltage terminal and said ground terminal;
- first to third amplification circuits which amplify control signals controlling said first to said third switches, respectively;
- a third voltage terminal;
- a fourth voltage terminal;
- a fourth switch connected between said first voltage terminal and said third voltage terminal;
- a fifth switch connected between said second voltage terminal and said fourth voltage terminal; and
- a metal substrate, and wherein said second power module section comprises:
- fourth and fifth amplification circuits which amplify control signals controlling said fourth and said fifth switches, respectively; and
- an insulating substrate,
- said first to said fifth switches and said first to said third amplification circuits being provided on said metal substrate, and said fourth and said fifth amplification circuits being provided on said insulating substrate.

34. A display device, comprising:
- a power module; and
- a display panel connected to said power module,
- said power module comprising a first power module section and a second power module section, modularized in the power module, wherein said first power module section comprises:
- a power-supply voltage terminal for inputting a power-supply voltage;
- a ground terminal;
- a first voltage terminal;
- a second voltage terminal;
- a first switch connected between said power-supply voltage terminal and said first voltage terminal;
- a second switch connected between said first voltage terminal and said ground terminal;
- a third switch connected between said second voltage terminal and said ground terminal;

first to third amplification circuits which amplify control signals controlling said first to said third switches, respectively;
a third voltage terminal connected to said display panel;
a fourth voltage terminal connected to said display panel;
a fourth switch connected between said first voltage terminal and said third voltage terminal;
a fifth switch connected between said second voltage terminal and said fourth voltage terminal; and
a metal substrate, and
wherein said second power module section comprises:
fourth and fifth amplification circuits which amplify control signals controlling said fourth and said fifth switches, respectively; and
an insulating substrate,
said first to said fifth switches and said first to said third amplification circuits being provided on said metal substrate, and said fourth and said fifth amplification circuits being provided on said insulating substrate.

35. The display device according to claim 34, wherein said display panel is a plasma display panel.

36. A power module comprising a first power module section and a second power module section, modularized in the power module.
wherein said first power module section comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
first to third amplification circuit which amplify control signals controlling said first to said third switches, respectively;
a third voltage terminal;
a fourth voltage terminal;
a fourth switch connected between said first voltage terminal and said third voltage terminal;
a fifth switch connected between said second voltage terminal and said fourth voltage terminal; and
a first metal substrate connected to said ground terminal, and
wherein said second power module section comprises:
fourth and fifth amplification circuits which amplify control signals controlling said fourth and said fifth switches, respectively; and
a second metal substrate connected to said second voltage terminal,
said first to said fifth switches and said first to said third amplification circuits being provided on said first metal substrate, and said fourth and said fifth amplification circuits being provided on said second metal substrate.

37. A display device, comprising:
a power module; and
a display panel connected to said power module,
said power module comprising a first power module section and a second power module section, modularized in the power module,
wherein said first power module section comprises:
a power-supply voltage terminal for inputting a power-supply voltage;
a ground terminal;
a first voltage terminal;
a second voltage terminal;
a first switch connected between said power-supply voltage terminal and said first voltage terminal;
a second switch connected between said first voltage terminal and said ground terminal;
a third switch connected between said second voltage terminal and said ground terminal;
first to third amplification circuits which amplify control signals controlling said first to said third switches, respectively;
a third voltage terminal connected to said display panel;
a fourth voltage terminal connected to said display panel;
a fourth switch connected between said first voltage terminal and said third voltage terminal;
a fifth switch connected between said second voltage terminal and said fourth voltage terminal; and
a first metal substrate connected to said ground terminal, and
wherein said second power module section comprises:
fourth and fifth amplification circuits which amplify control signals controlling said fourth and said fifth switches, respectively; and
a second metal substrate connected to said second voltage terminal,
said first to said fifth switches and said first to said third amplification circuits being provided on said first metal substrate, and said fourth and said fifth amplification circuits being provided on said second metal substrate.

38. The display device according to claim 37, wherein said display panel is a plasma display panel.

39. The power module according to claim 25, further comprising:
a sixth switch connected to said third voltage terminal through a coil;
a seventh switch connected to said fourth voltage terminal through a coil;
sixth and seventh amplification circuits which amplify control signals controlling said sixth and said seventh switches, respectively; and
third and fourth input wiring connected to inputs of said sixth and said seventh amplification circuits,
said first to said seventh switches and said first to said third amplification circuits, except all or part of said fourth to said seventh amplification circuits and said first to said fourth input wiring, being provided on said metal substrate.

40. The power module according to claim 39, wherein all or part of said fourth to said seventh amplification circuits and said first to said fourth input wiring are provided on a plastic substrate or a ceramic substrate.

41. The power module according to claim 29, wherein said second power module section, further comprises:
a sixth switch connected to said third voltage terminal through a coil;
a seventh switch connected to said fourth voltage terminal through a coil; and
sixth and seventh amplification circuits which amplify control signals controlling said sixth said seventh switches, respectively,
said fourth to said seventh switches and said fourth to said seventh amplification circuits, being provided on said second metal substrate.

42. The power module according to claim 41, wherein said first metal substrate is connected to said ground terminal, and said second metal substrate is connected to said second voltage terminal.

43. The power module according to claim 33, wherein said first power module section, further comprises:

a sixth switch connected to said third voltage terminal through a coil; and a seventh switch connected to said fourth voltage terminal through a coil, and wherein said second power module section, further comprises:

sixth and seventh amplification circuits which amplify control signals controlling said sixth and said seventh switches, respectively, said first to said seventh switches and said first to said third amplification circuits being provided on said metal substrate, and said fourth to said seventh amplification circuits being provided on said insulating substrate.

44. The power module according to claim 36, wherein said first power module section, further comprises:

a sixth switch connected to said third voltage terminal through a coil; and a seventh switch connected to said fourth voltage terminal through a coil, and wherein said second power module section, further comprises:

sixth and seventh amplification circuits which amplify control signals controlling said sixth and said seventh switches, respectively, said first to said seventh switches and said first to said third amplification circuits being provided on said first metal substrate, and said fourth to said seventh amplification circuits being provided on said second metal substrate.

* * * * *

UNITED STATES PATENT AND TRADEMARK OFFICE
CERTIFICATE OF CORRECTION

| | |
|---|---|
| PATENT NO. | : 7,106,320 B2 |
| APPLICATION NO. | : 10/321363 |
| DATED | : September 12, 2006 |
| INVENTOR(S) | : Makoto Onozawa et al. |

It is certified that error appears in the above-identified patent and that said Letters Patent is hereby corrected as shown below:

First Page, Column 2 (U.S. Patent Documents), Line 1, after "Nakamura et al." insert --345/204--.

Column 24, Line 35, change "a first to a" to --first to--.

Column 29, Line 24, change "module." to --module,--.

Column 29, Line 37, change "circuit" to --circuits--.

Signed and Sealed this

Third Day of April, 2007

JON W. DUDAS
*Director of the United States Patent and Trademark Office*